United States Patent [19]

Takashi et al.

[11] Patent Number: 5,572,157
[45] Date of Patent: Nov. 5, 1996

[54] DIGITAL PHASE-LOOKED LOOP CIRCUIT

[75] Inventors: Terumi Takashi, Ebina; Kazunori Iwabuchi, Yokohama; Minoru Kosuge, Odawara; Hiromi Matsushige, Odawara; Hideki Miyasaka, Odawara, all of Japan

[73] Assignee: Hitachi, Ltd., Tokyo, Japan

[21] Appl. No.: 21,854

[22] Filed: Feb. 24, 1993

[30] Foreign Application Priority Data

Feb. 24, 1992 [JP] Japan .................................. 4-036603

[51] Int. Cl.⁶ .................................. H03L 7/085
[52] U.S. Cl. .................. 327/156; 327/160; 327/162
[58] Field of Search ........................ 328/155; 327/262, 327/141, 155, 156–160, 162, 163, 244, 91, 94; 331/1 A, 17, 25, 1 R, 25; 375/120, 376

[56] References Cited

U.S. PATENT DOCUMENTS

| | | | |
|---|---|---|---|
| 3,983,498 | 9/1976 | Malek | 328/155 |
| 3,983,506 | 9/1976 | Rettinger, Jr. | 327/156 |
| 4,280,099 | 7/1981 | Rattlingourd | 328/155 |
| 4,325,031 | 4/1982 | Ooms et al. | 327/156 |
| 4,418,318 | 11/1983 | Swagerty et al. | 375/120 |
| 4,563,767 | 1/1986 | Brandt | 375/120 |
| 4,577,163 | 3/1986 | Culp | 328/155 |
| 4,635,280 | 1/1987 | Smith et al. | 375/120 |
| 4,696,191 | 11/1990 | Masson et al. | 331/1 A |
| 4,800,342 | 1/1989 | Jackson | 331/17 |
| 4,808,884 | 2/1989 | Hull et al. | 375/120 |
| 4,868,523 | 9/1989 | Petersson | 331/25 |
| 4,926,141 | 5/1990 | Herold et al. | 331/17 |
| 5,018,170 | 5/1990 | Wilson | 331/25 |
| 5,052,031 | 9/1991 | Molloy | 331/25 |
| 5,068,625 | 11/1991 | Baker et al. | 331/1 A |
| 5,140,284 | 8/1992 | Petersson | 331/25 |
| 5,168,245 | 12/1992 | Koskowich | 331/1 A |
| 5,194,828 | 3/1993 | Kato et al. | 331/1 A |
| 5,233,314 | 8/1993 | McDermott et al. | 328/155 |
| 5,258,725 | 11/1993 | Kinoshita | 331/17 |
| 5,268,653 | 12/1993 | Lafon | 331/1 A |
| 5,315,270 | 5/1994 | Leonowich | 331/17 |

*Primary Examiner*—Timothy P. Callahan
*Assistant Examiner*—T. Lam
*Attorney, Agent, or Firm*—Antonelli, Terry, Stout & Kraus

[57] ABSTRACT

Count pulses CTP from a counter 15 are supplied to a phase detector 3 through a two-frequency-divider 17 to produce measurement data $N_1$ representing a difference in phase from a synchronized peak pulses PK. In a subtractor 4, the measurement data $N_1$ is compensated with error data Ne from a register 13 in order to reduce the number of steady-state phase errors. An internal phase error $\Delta N$ produced by the subtractor 4 is supplied to an LPF 5, undergoing compensation processing in a digital filter 7 thereof. The LPF 5 also includes a phase compensator 6 and a period compensator 8 for compensating a control delay experience by the internal phase error $\Delta N$ in the digital filter 7. An integer part OPD1 of counter oscillation period data OPD output by the LPF 5 is used for determining an oscillation period of a counter 15 whereas a fraction part OPD2 thereof is accumulated in a register 12 through an adder 11. An error accumulated in a register 12 is transferred to a register 13 and stored therein as error data Ne. Accordingly, the acquisition time is shortened and the number of steady-state errors is also reduced as well.

25 Claims, 22 Drawing Sheets

| CONTROL DELAY | PHASE MARGIN | |
|---|---|---|
| | LOW GAIN | HIGH GAIN |
| PRESENT | 60° | 40° |
| ABSENT | 60° | 60° |

DIGITAL PHASE-LOOKED LOOP CIRCUIT

BACKGROUND OF THE INVENTION AND RELATED ART

The present invention relates to a phase-locked loop circuit suitable for use in a magnetic-disk drive, a magnetic-tape drive or the like. In particular, the present invention relates to a digital phase-locked loop circuit for shortening the synchronization time and reducing steady-state phase jitters.

In recent years, digital-signal processing technologies are embraced in order to reduce the hardware size and to enhance the performance of an external storage device of a computer such as a magnetic-disk drive, a magnetic-tape drive or other storage-media drives. There are many examples in which the conventional analog circuit is implemented into a digital configuration. In particular, in the case of a phase-locked loop circuit (which is referred to hereafter as a PLL circuit), operating conditions can be set externally with ease. Accordingly, a PLL adopting a digital technique, which is referred to hereafter as a digital PLL, is proposed. For example, in the case of a PLL embracing an analog technique (referred to hereafter as an analog PLL) disclosed in Japanese Patent Laid-open No. 62-39915, the digital PLL is implemented by including digital circuits such as counters, processing circuits and delay elements in the configuration thereof as components.

A block diagram of a typical digital PLL circuit cited above is shown in FIG. 23. Reference numerals 101 and 102 shown in the figure each denote a counter whereas reference numeral 103 is a subtractor. Reference numeral 104 is a filter circuit. Reference numerals 73a to 73c and 74a to 74c each denote a delay element. Reference numerals 106 and 107 are a processor and a phase shift-oscillator respectively.

The frequency of a reference clock signal $\phi_0$ used in the PLL circuit shown in the figure is set to a value several tens times the frequency of a peak pulse signal Pin, an input pulse signal obtained by typically reconstructing the wave form of a signal generated from a recording medium. Using the reference clock signal $\phi_0$, the digital PLL circuit produces an output pulse signal Pout with a phase matching that of the input peak pulse signal Pin.

To be more specific, the frequency of the reference clock signal $\phi_0$ is divided by the counter 101 to produce a variable pulse signal VP having a period equal to that of the input peak pulse signal Pin. The counter 102 measures the time gap between the input peak pulse signal Pin and the variable pulse signal VP in terms of pulses of the reference clock signal $\phi_0$, outputting a phase difference X(u), a digital value representing the time gap. For example, if the input peak pulse signal Pin and the variable pulse signal VP have fixed periods equal to each other, the phase difference is also fixed and equal to an initial value. For example, if the initial difference in phase between the input peak pulse signal Pin and the variable pulse signal VP is equal to two periods (2 $t_0$) of the reference clock signal $\phi_0$ as shown in FIG. 24, the counter 102 outputs a value of 2 to represent the phase difference X(u). Hereafter, the value 2 may be expressed as '2'. The phase difference X(u) is supplied to the subtractor 103. The filter circuit 104 calculates a currently-to-be-held phase difference Y(u) in synchronization with the variable pulse signal VP. The subtractor 103 substracts the currently-to-be-held phase difference Y(u) from the phase difference X(u) to produce a phase error Z(u)=(X(u)–Y(u)). The phase error Z(u) is fed back to the filter circuit 104.

The phase error Z(u) is delayed by the delay elements 73a, 73b and 73c each time it is supplied to the filter circuit 104. In this way, last three pieces of phase error data Z(u) supplied so far are stored. The currently-to-be-held phase difference Y(u) is also delayed by the delay elements 74a, 74b and 74c each time it is produced by the processor 106. Similarly, last three pieces of phase difference data Y(u) generated so far are stored. The processor 106 calculates the currently-to-be-held phase difference Y(u) from the stored three pieces of phase error data Z(u) and the stored three pieces of phase difference data Y(u). The processing carried out by the processor 106 changes the computed value of the phase difference Y(u) until the phase error Z(u) becomes a zero, causing the phase difference Y(u) to finally settle at a fixed value.

When the phase difference Y(u) no longer changes and the value of the phase error Z(u) is zero, the phase difference Y(u) output by the filter circuit 104 is equal to the phase difference X(u), representing a difference in phase between the input peak pulse signal Pin and the variable pulse signal VP. Accordingly, the phase-shift oscillator 107 shifts the variable pulse signal VP by an amount corresponding to the value of the phase difference Y(u), generating an output pulse signal Pout having a phase matching that of the input peak pulse signal Pin.

The conventional technology, wherein components of the analog PLL circuit are replaced by digital devices, has been described so far. In the above description, however, only the configuration of the digital PLL circuit and an operation carried out only for coping with an initial difference in phase between the input peak pulse signal Pin and the output pulse signal Pout are covered. The description given so far does not include the following problems encountered in the conventional technology.

First of all, it takes a long time, in comparison to the analog PLL circuit, to generate an output pulse signal Pout as a control result for a detected phase difference. In the case of the analog PLL circuit, the phase of the output pulse signal Pout starts to change as soon as a phase difference is detected. In the digital PLL circuit, however, the control is inevitably delayed by at least about one period of the output pulse signal Pout because it takes time for the filter circuit 104 to perform processing and to pass control values. In the case of the control process for coping with an initial difference in phase disclosed in Japanese Patent Laid-open No. 62-39915 described above, an effect of the control delay is not seen clearly in a low speed lock-in PLL characteristic. However, the PLL characteristic which is required in a magnetic-disk drive or a magnetic tape-drive is a high speed lock-in PLL characteristic. In such a drive, the time to get the phase locked, which is referred to hereafter as an acquisition time, has to be shortened. In such a case, delayed control variables inevitably affect the PLL characteristic much. This is because a phase margin is eliminated by an internal delay occurring in the feedback loop. A comparison of phase margins between cases with and without an internal delay occurring in the feedback loop for an analog PLL circuit is shown in FIG. 25. With an internal delay occurring in the feedback loop, the PLL characteristic reveals undesired vibratory components due to the elimination of the phase margin as shown in FIG. 26, lengthening the acquisition time. Accordingly, the delay times of control variables impose constraints on the minimum length of the acquisition time, giving rise to a problem that the acquisition time cannot be further shortened.

Secondly, the period of the input peak pulse signal Pin is not necessarily an exact multiple of the period of the reference clock signal $\phi_0$. Accordingly, the edges of the input peak pulse signal Pin vibrate relatively to those of the reference clock signal $\phi_0$, causing steady-state phase errors known as steady-state jitters to appear in the output pulse signal Pout. In the conventional technology described above, a control variable is measured in terms of periods of the reference clock signal $\phi_0$. Therefore, large steady-state jitters with an absolute value of up to one period are generated in the phase difference X(u) output by the counter 102. As a result, steady-state jitters having a magnitude in the range minus one period to plus one period of the reference clock signal $\phi_0$ are seen in the output pulse signal Pout. In order to suppress the steady-state jitters, a reference clock signal $\phi_0$ with a higher frequency is taken into consideration. To design a digital PLL circuit with the magnitude of its steady-state jitters kept in the range, say, $-2$ nsec to $+2$ nsec, however, it is necessary to set a reference clock signal $\phi_0$ to a very high frequency of 500 MHz. At such a high frequency, it becomes extremely difficult to design digital circuits and, in addition, a problem of increased power consumption is also encountered as well.

OBJECT OF THE INVENTION

It is a first object of the present invention to provide a digital PLL circuit which allows the acquisition time to be shortened and, thus, the problems described above to be solved.

It is a second object of the present invention to provide a digital PLL circuit which allows the absolute value of the magnitude of the steady-state jitters to be kept within a range not exceeding half the period of the reference clock signal $\phi_0$.

SUMMARY OF THE INVENTION

In order to achieve the first object, the present invention provides a phase compensation means and a period compensation means for keeping a phase error supplied to a digital filter at values equal to those obtained with no control delays. In addition, a minimum-phase detection means is provided for detecting an input peak pulse signal with a small initial phase difference and, thus, allowing the PLL operation to be started with the input peak pulse signal with the small initial phase difference.

The phase compensation means affects the input of the digital filter. To be more specific, the phase compensation means finds a difference in phase equal to that obtained without a control delay from the output of the digital filter, supplying the difference in phase to the digital filter. The period compensation means, on the other hand, affects the output of the digital filter. It serves as an auxiliary means of the phase compensation means by compensating an oscillatory period. The phase and period compensation means result in a difference in phase equal to that obtained with no control delay as an input to the digital filter. Accordingly, the PLL characteristic identical with that of a PLL circuit without a control delay can be obtained regardless of any control delays which actually occurs. As a result, the PLL characteristic does not oscillate in spite of delayed control variables and, at the same time, the acquisition time can be shortened.

The minimum-phase detection means, on the other hand, detects an input peak pulse that has a phase closest to the output pulses, starting the PLL operation from the detected input peak pulse. In this way, the initial difference in phase can thereby be reduced. When normalized using the initial difference in phase, the PLL characteristics obtained will all be the same. The absolute magnitude of a PLL characteristic is proportional to its corresponding initial difference in phase. Accordingly, the smaller the initial difference in phase, the shorter the time for the phase to get locked. As a result, it seems possible to shorten the acquisition time.

In addition, in order to achieve the second object, the present invention provides an internal-error accumulation means for sequentially accumulating quantization errors and, thus, enhancing the accuracy of the control performed by the digital filter, and a processing means for adding internally accumulated errors to a difference in phase. More accurate control by the digital filter results in periods oscillating with a smaller amplitude. By quantization errors, errors in control variables quantized by reference clock pulses are meant.

The internal error accumulation means quantizes the accuracy of the vibration period of the digital filter in terms of periods of the reference clock signal, sequentially accumulating its internal errors. The processing means processes the accumulated internal errors and differences in phase between input peak pulses and output pulses, supplying processing results to the digital filter. By processing the internally accumulated errors and the differences in phase, it is considered that differences in phase between input peak pulses and output pulses before quantization can be found. By supplying the differences in phase as a feedback, the digital filter outputs values equal to the periods of the input peak pulses. Accordingly, the output pulse signal matches the input peak pulse signal after sampling. As a result, steady-state phase errors comprise only sampling errors of the input peak pulse signal, hence, having absolute values equal to or smaller than half the period of the reference clock signal.

As described above, the phase compensation means and the period compensation means provided by the present invention allow the phase margin to be kept at a value equal to that obtained with no control delay even if control delays are introduced by the digital filter. Accordingly, the PLL characteristic is not oscillatory and the acquisition time can be shortened. Furthermore, a phase detector allows the initial difference in phase between the desired output pulse signal and the input peak pulse signal to be reduced and, thus, the acquisition time to appear short.

In addition, the internal error accumulation means provided by the present invention allows the differences in phase between the output pulse signal and the input peak pulse signal to be detected with a higher degree of accuracy. Accordingly, the frequency of the reference clock signal can be made smaller and the absolute values of the steady-state phase errors can be reduced to a level equal to or smaller than half the period of the reference clock signal. As a result, remarkable effects such as simplified circuit design and reduced power consumption are obtained.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

By referring to the accompanying diagrams, a preferred embodiment is described in detail as follows.

Figure 1:
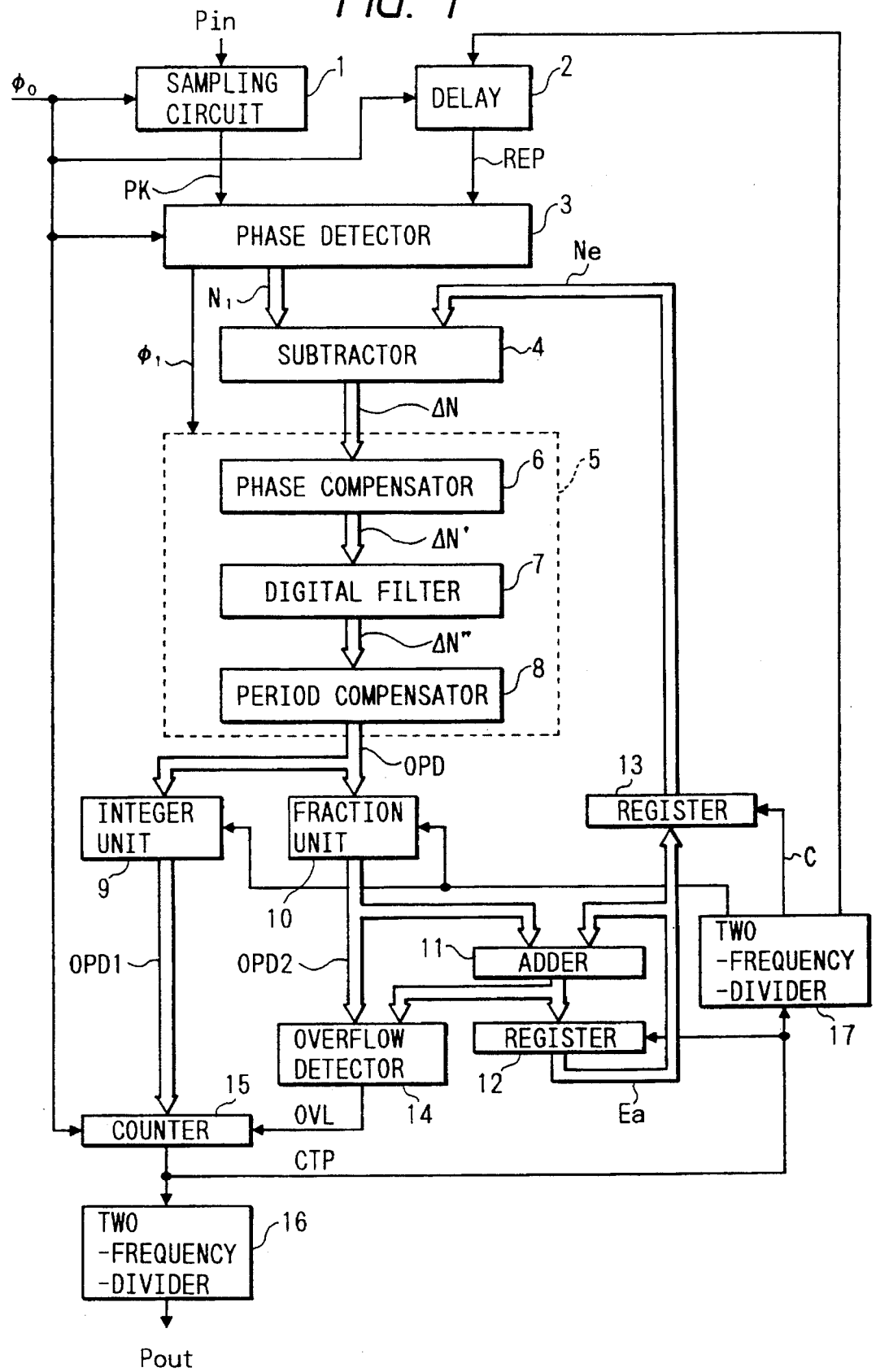
FIG. 1 shows a block diagram of an embodiment implementing a digital PLL circuit in accordance with the present invention.

FIG. 1 shows a block diagram of an embodiment implementing a digital PLL circuit in accordance with the present invention. Numeral reference 1 shown in the figure is a sampling circuit whereas reference numeral 2 denotes a synchronized circuit. Reference numerals 3 and 4 are a phase detector and a subtractor respectively. Reference numeral 5 denotes an LPF (Low-Pass Filter) while reference numeral 6 is a phase compensator. Reference numerals 7 and 8 denote a digital filter and a period compensator respectively. Reference numeral 9 is an integer unit whereas reference numeral 10 is a fraction unit. Reference numeral 11 is an adder. Reference numerals 12 and 13 each denote a register. Reference numerals 14 and 15 are an overflow detector and a counter respectively. Reference numerals 16 and 17 are each a two-frequency-divider.

This embodiment is configured into a second-order complete-integral PLL. Basically, the PLL circuit carries out PLL control so that the phase of an input peak pulse signal Pin supplied to the sampling circuit 1 matches that of a comparison-reference pulse signal REP output by the synchronized circuit 2. In this basic configuration, the counter 15 serves as an oscillator circuit which has a variable oscillation frequency. A count pulse signal CTP output by the counter 15 is supplied to the phase detector 3 through the two-frequency-divider 17. The phase detector 3 compares the phase of the output of the two-frequency-divider 17 to that of a synchronized peak pulse signal PK, a signal obtained by sampling the input peak pulse signal Pin with a reference clock signal $\phi_0$. Measurement data $N_1$, which represents the difference in phase, undergoes phase and period compensations in the LPF 5 to produce counter oscillation period data OPD, a compensated output for controlling the oscillation period of the counter 15. The digital filter may produce a numerical value OPD with a floating decimal point by calculating an internal phase error $\Delta N$. The decimal part of the numerical value OPD are accumulated in the register 12 to result in an accumulated error Ea which is subtracted by the subtractor 4 from the measurement data $N_1$ output by the phase detector 3.

Components constituting the embodiment shown in FIG. 1 are described as follows.

The input peak pulse signal Pin is obtained by waveshaping a signal generated typically by a recording medium which is not shown in the figure. The sampling circuit 1 samples the input peak pulse signal Pin by using the reference clock signal $\phi_0$. The input peak pulse signal Pin is sampled on the rising and trailing edges of the reference clock signal $\phi_0$ to produce the synchronized peak pulse signal PK with a sampling error relative to the input peak pulse signal Pin having absolute values equal to or smaller than half the period of the reference clock signal $\phi_0$.

The phase detector 3 measures the difference in phase between the synchronized peak pulse signal PK and the comparison-reference pulse signal REP in terms of periods of the reference clock signal $\phi_0$ to give the measurement data $N_1$ the value of which represents the difference in phase. The measurement data $N_1$ always represents a correct difference in phase and is not affected by unwanted pulses introduced in the synchronized peak pulse signal PK by, among other things, noise, or missing pulses therefrom. The comparison-reference pulse signal REP is obtained by dividing the count pulse signal CTP output by the counter 15 using the twofrequency-divider 17 and then delaying the output of the two-frequency-divider 17 by the synchronized circuit 2. The output of the two-frequency-divider 17 is synchronized by the synchronized circuit 2 with the reference clock signal $\phi_0$. The count pulse signal CTP has a frequency twice that of the output pulse signal which is obtained eventually. Therefore, the frequencies of comparison pulses C and reference pulses W of the comparison-reference signal REP are made equal to the frequency of the synchronized peak pulse signal PK by means of the two-frequency-divider 17. Note that the comparison and reference pulses C and W will be described later.

The subtractor 4 subtracts error data Ne output by the register 13 from the measurement data $N_1$ produced by the phase detector 3 to give an internal phase error $\Delta N$ as a subtraction result. The internal phase error $\Delta N$ is supplied to the LPF 5 which comprises the phase compensator 6, the digital filter 7 and the period compensator 8. As will be described later, the phase compensator 6, the digital filter 7 and the period compensator 8 of the LPF 5 perform averaging and compensation on the internal phase error $\Delta N$, outputting oscillation period data OPD representing the oscillation period of the counter 15. The counter oscillation period data OPD has a value equal to twice the period of the desired output pulse signal Pout.

The value of the counter oscillation period data OPD produced as a result of processings by the LPF 5 is a number which comprises integer and fraction parts. The integer and fraction parts are extracted by the integer unit 9 and the fraction unit 10 to produce an integer part OPD1 before a decimal point and a fraction part OPD2 after the decimal point respectively at timing controlled by the comparison pulses C of the comparison-reference signal REP generated by the two-frequency-divider 17.

The fraction part OPD2, which is extracted by the fraction unit 10 and represents an error contained in the counter oscillation period data OPD, is supplied to the adder 11 to be added to the contents of the register 12. The result of the addition is loaded back into the register 12 with timing of the count pulse signal CTP. In this way, an accumulated value of the errors is stored in the register 12. The accumulated value stored in the register 12 is referred to hereafter as the accumulated error Ea. The accumulated error Ea is transferred to the register 13 at times determined by the comparison pulses C output by the two-frequency-divider 17. The accumulated error Ea represents a difference in phase between the count pulse signal CTP and the synchronized peak pulse signal PK. The accumulated error Ea stored in the register 13 through the register 13 (i.e., error data Ne) is supplied to the subtractor 4 for compensating the measurement data $N_1$ output by the phase detector 3 in such a way that the phase of the count pulse signal CTP produced next by the counter 15 matches that of the synchronized peak pulse signal PK. The compensated internal phase error $\Delta N$ is supplied to the LPF 5.

A value of at least one of the fraction part OPD2 extracted by the fraction unit 10 and the accumulated error Ea stored in the register 12 exceeding the range −0.5 to +0.5 is detected by the overflow detector 14 as an overflow which is indicated by the overflow detector 14 as an output OVL with the logic value "H". In this case, the oscillation period stored in the counter 15 is incremented by one period of the reference clock signal $\phi_0$.

The two-frequency-divider 17 divides the frequency of the count pulse signal CTP in such a way that the ratio of the period of the synchronized peak pulse signal PK obtained during the PLL process to the period of the comparison pulse C or the reference pulse W of the comparison-reference pulse signal REP is equal to unity. In the case of a lock in operation (high gain), the frequency of the count pulse CTP is divided by two. In a following operation (low gain), however, the two-frequency-divider 17 does not divide the frequency but directly outputs the count pulse signal CTP instead.

Figure 2:
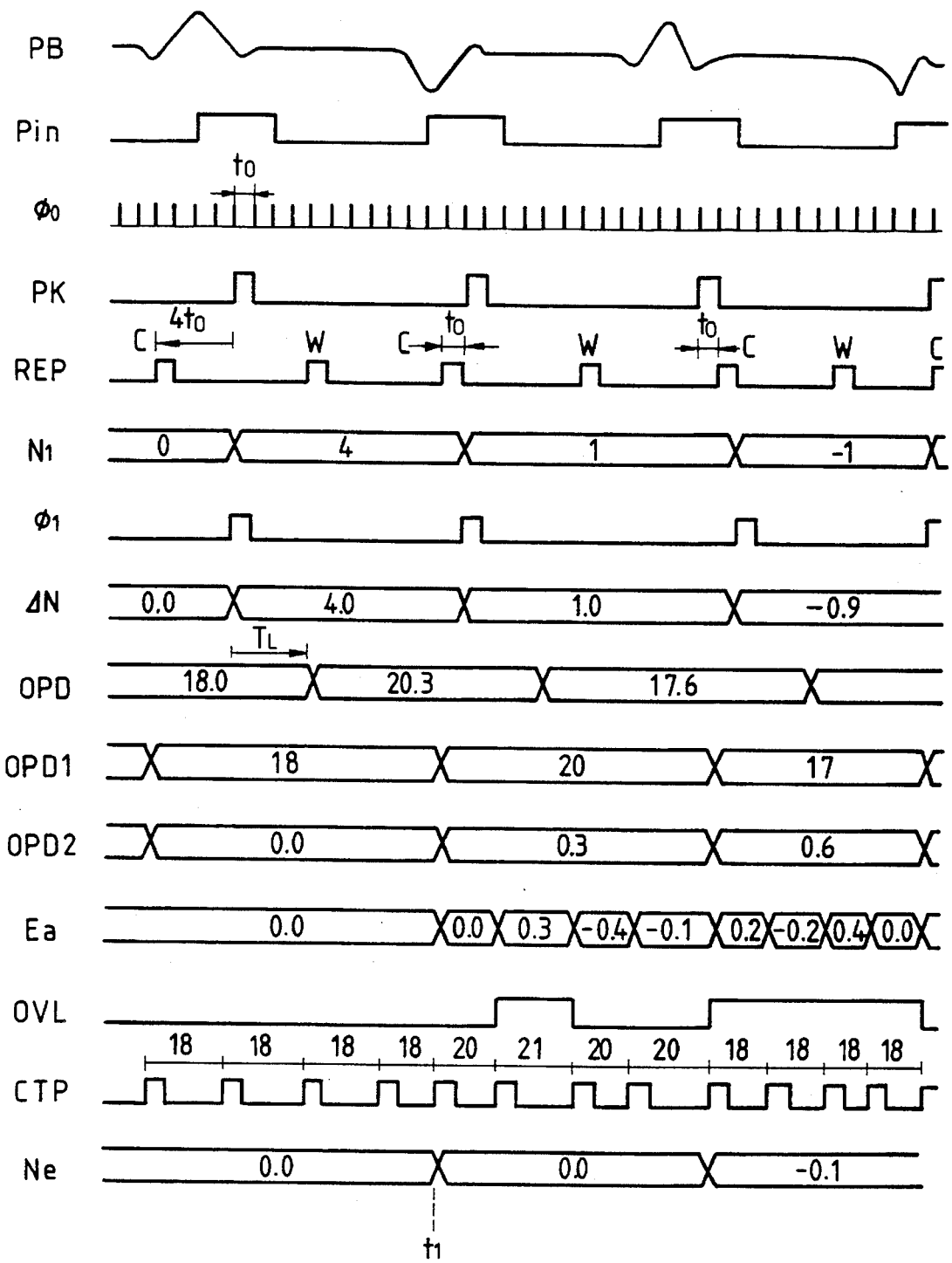
FIG. 2 shows operation timing charts of the embodiment shown in FIG. 1.

FIG. 2 shows overall operation timing charts of the embodiment shown in FIG. 1. The same reference numerals as those shown in FIG. 1 are used to denote the same components. The operation of the embodiment shown in FIG. 1 is explained below by referring to the timing charts of FIG. 2.

The input peak pulse signal Pin is generated by wave-shaving a signal PB produced from a recording medium. The input peak pulse signal Pin is sampled by the sampling circuit 1 at times set by the reference clock signal $\phi_0$ to result in the synchronized peak pulse PK. The phase of the synchronized peak pulse PK is compared by the phase detector 3 to that of the comparison pulses C of the comparison-reference pulse signal REP output by the synchronized circuit 2. The comparison-reference pulse signal REP comprises the comparison pulses C and the reference pulses W which are arranged to alternate with each other. The two-frequency-divider 17 operates in such a way that the periods of the pulses C and W match that of the synchronized peak pulse signal PK.

The phase detector 3 outputs the measurement data $N_1$ which represents a difference in phase between the synchronized peak pulse signal PK and the comparison pulse signal C. Here, let $t_0$ be the period of the reference clock signal $\phi_0$. Assume that the values of the difference in phase between the synchronized peak pulse signal PK and the comparison pulse signal C are $4t_0$, $t_0$ and $t_0$ as shown in the figure. The value is assigned the positive sign '+' for a synchronized peak pulse signal PK lagging behind the comparison pulses C or the negative sign '−' for a synchronized peak pulse signal PK leading ahead of the comparison pulses C. In this case, the values of the measurement data $N_1$ are therefore 4, 1 and −1. For the measurement data $N_1$ having a value of 4 and the error data Ne from the register 13 having a value of 0.0 for example, the subtractor 4 outputs the internal phase error $\Delta N$ with a value of 4.0.

The internal phase error $\Delta N$ having a value of 4.0 is processed by the LPF 5. Assume that the LPF 5 outputs the counter oscillation period data OPD with a value of 20.3 after a processing time has lapsed as shown in the figure. At the timing of a next comparison pulse, the integer part OPD1, which has a value of 20.0 in this case, is extracted by the integer unit 9 and then loaded into the counter 15 to set the oscillation period of the counter 15 to $20t_0$.

Prior to the operation described above, the value of the counter oscillation period data OPD output by the LPF 5 is 18.0, setting the oscillation period of the counter 15 to $18t_0$. At that time, a fraction part OPD2 of 0.0 is extracted by the fraction unit 10. Let the initial value of the accumulated error Ea stored in the register 12 be 0.0. In this case, the accumulated error Ea stored in the register 12 remains at a value of 0.0. Note that the accumulated error Ea is updated at timing determined by the count pulse signal CTP having a period of $18t_0$.

As the value of the counter oscillation period data OPD changes to 20.3, setting the oscillation period of the counter 15 to $20t_0$ as described above, its fraction part OPD2 having a value of 0.3 is extracted by the fraction unit 10 and then sent to the adder 11 to be added to the accumulated error Ea with a value of 0.0 stored in the register 12. The result of the addition is supplied to the overflow detector 14 and to the register 12 at timing set by the count pulse signal CTP. In the register 12, the result of the addition is processed in accordance with Eq. (1) given below:

$$\text{mod}((\text{addition result} +0.5), 1) - 0.5 \quad (1)$$

where mod (a,b) is a remainder obtained from division of a by b. The result of the addition is fed to the adder 11 and the register 13 as the accumulated error Ea. Here, at a time $t_1$ shown in the figure, the value of the accumulated error Ea stored in the register 12 is 0.0. At that time, feeding the fraction part OPD2 with a value of 0.3 to the adder 11 will yield the following result of addition out off the adder 11:

$$0.0+0.3=0.3$$

The result of the addition 0.3 is loaded into the register 12, undergoing the processing in accordance with Eq. (1) as follows:

(addition result+0.5)=(0.3+0.5)=0.8 mod ((addition result+0.5), 1)−0.5=mod(0.8, 1)−0.5=0.8−0.5=0.3

Accordingly, the accumulated error Ea having a value of 0.3 is supplied from the register 12 to the adder 11 and the register 13.

At the timing of a next count pulse CTP, the fraction part OPD2 with a value of 0.3 to is supplied to the adder 11 to yield the following result of addition out off the adder 11:

$$0.3+0.3=0.6$$

The result of the addition 0.6 is loaded into the register 12, undergoing the processing in accordance with Eq. (1) as follows:

(addition result+0.5)=(0.6+0.5)=1.1 mod ((addition result+0.5), 1)−0.5=mod(1.1, 1)−0.5=0.1−0.5=−0.4

Accordingly, the accumulated error Ea having a value of 0.3 is supplied from the register 12 to the adder 11 and the register 13.

Thereafter, when a counter oscillation period data is output by the LPF 5 to indicate a difference in phase between the comparison pulse signal C and the synchronized peak pulse signal PK as shown in the figure, the accumulated error having a value in the range −0.5 to +0.5 is output from the register 12 through the same processing described above.

If the result of the addition output by the adder 11 has a value beyond the range −0.5 to +0.5, the signal OVL output by the overflow detector 14 is set to the "H" level to indicate an overflow. In this case, the oscillation period of the counter 15 is lengthened by one period of the reference pulse signal $\phi_0$ instead of being preset at the value of the integer part OPD1.

The accumulated error Ea from the register 12 is loaded into the register 13 with timing determined by the comparison pulses C produced by the two-frequency-divider 17. The register 13, in turn, supplies its contents to the subtractor 4 as the error data Ne. Accordingly, the error data Ne also has a value in the range −0.5 to +0.5 as well.

Next, actual examples of components employed by the embodiment shown in FIG. 1 are described. It should be noted, however, that in order to simplify the description, the period of the input peak pulse signal Pin is assumed to be six times that of the reference clock signal $\phi_0$.

Figure 3:
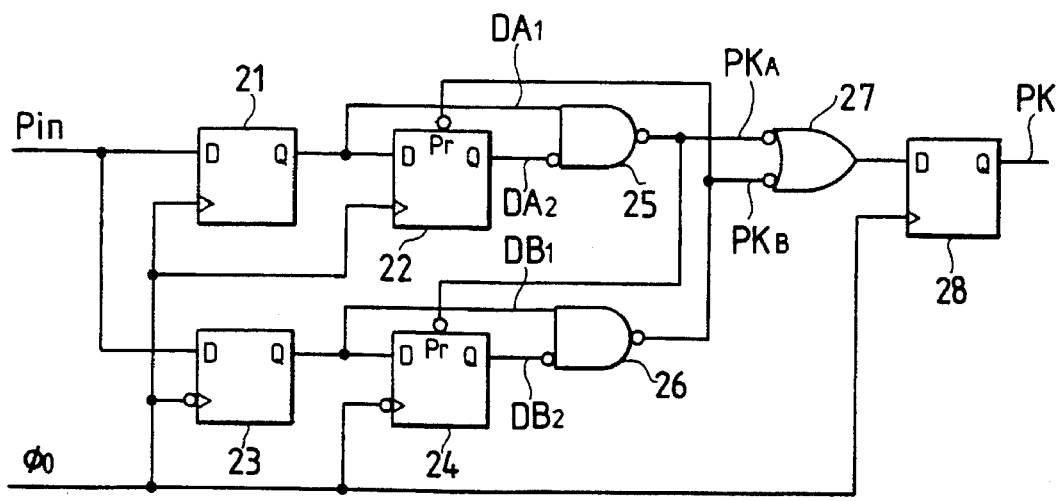
FIG. 3 shows a block diagram of an actual example of a sampling circuit employed in the embodiment shown in FIG. 1.

FIG. 3 shows a block diagram of an actual example of the sampling circuit 1 employed in the embodiment shown in FIG. 1. Reference numerals 21 to 24 shown in the figure each denote a D-FF (D-type flip-flop) circuit whereas reference numerals 25 and 26 are each a NAND gate. Reference numerals 27 and 28 are an OR gate and a D-FF circuit respectively.

Figure 4:
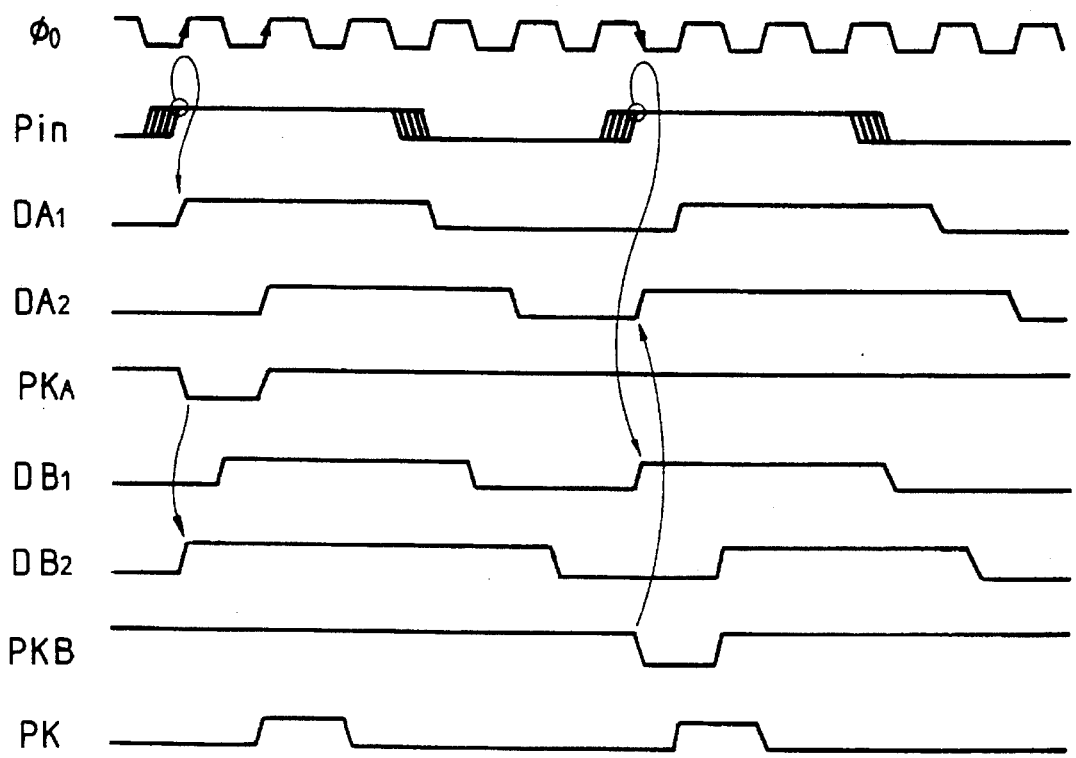
FIG. 4 shows operation timing charts of the sampling circuit shown in FIG. 3.

FIG. 4 shows operation timing charts for a variety of signals generated in the sampling circuit 1 shown in FIG. 3. Note that the same notations as those shown in FIG. 3 are used to denote the same signals.

The D-FF circuits 21 and 22 sample and hold the input peak pulse signal Pin supplied thereto on the rising edge of the reference clock signal $\phi_0$. On the other hand, the D-FF circuits 23 and 24 sample and hold the input peak pulse signal Pin supplied thereto on the trailing edge of the reference clock signal $\phi_0$. As shown in FIG. 4, the Q outputs DA1 and DB1 of the D-FF circuits 21 and 23 go high after the rising edge of the input peak pulse signal Pin at different times depending upon the timing of the leading edge or trailing edge of the reference clock signal $\phi_0$ relative to that of the input peak pulse signal Pin. To be more specific, when the input peak pulse Pin rises while the reference clock signal $\phi_0$ is at the "L" level, the Q output DA1 of the D-FF circuit 21 rises first and is then followed by the output DB1 of the D-FF circuit 23. When the input peak pulse Pin rises while the reference clock signal $\phi_0$ is at the "H" level, on the other hand, the Q output DB1 of the D-FF circuit 23 rises first and is then followed by the output DA1 of the D-FF circuit 21.

The NAND gates 25 and 26 and the OR gate 27 are used to detect which of the Q outputs DA1 and DB1 of the D-FF circuits 21 and 23 rises first. The detection is accomplished as follows. The Q output DA1 of the D-FF circuit 21 is directly supplied to the NAND gate 25 while it is the inverted signal of the Q output DA2 of the D-FF circuit 22 that is supplied to the NAND gate 25. Likewise, the Q output DB1 of the D-FF circuit 23 is directly supplied to the NAND gate 26 while it is the inverted signal of the Q output DB2 of the D-FF circuit 24 that is supplied to the NAND gate 26. The outputs PKA and PKB of the the NAND gates 25 and 26 respectively are inverted and then supplied to the OR gate 27. The output PKA of NAND gate 25 is also connected to the preset pin of the D-FF circuit 24 so that its Q output DB2 is raised to the "H" level on the trailing edge of the output PKA. The output PKB of the NAND gate 26 is also connected to the preset pin of the D-FF circuit 22 so that its Q output DA2 is raised to the "H" level on the trailing edge of the output PKB.

Here, let the Q output DA1 of the D-FF circuit 21 rise before the Q output DB1 of the D-FF circuit 23 goes high. On the rising edge of the Q output DA1 of the D-FF circuit 21, one of the inputs of the NAND gate 25 is raised to the "H" level, setting its output PKA to the "L" level. At the same time, the Q output DB2 of the D-FF circuit 24 is preset to the "H" level, terminating its operation. The D-FF circuit 24 remains in the preset state until a next reference clock $\phi_0$ rises. In the mean time, the current reference clock $\phi_0$ goes low, raising the the Q output DB1 of the D-FF circuit 23. Nevertheless, the output PKB of the NAND gate 26 is sustained at the "H" level because the D-FF circuit 24 remains preset. Accordingly, the output of the OR gate 27 rises on the trailing edge of the output PKA of the NAND gate 25 and remains at the "H" level for one period of the reference clock signal $\phi_0$.

Now, let the Q output DB1 of the D-FF circuit 23 rise before the Q output DA1 of the D-FF circuit 21 goes high. On the rising edge of the Q output DB1 of the D-FF circuit 23, one of the inputs of the NAND gate 26 is raised to the "H" level, setting its output PKB to the "L" level. At the same time, the Q output DA2 of the the D-FF circuit 22 is preset to the "H" level, terminating its operation. The D-FF circuit 22 remains in the preset state until a next reference clock $\phi_0$ rises. In the mean time, the current reference clock $\phi_0$ goes low, raising the the Q output DA1 of the D-FF circuit 21. Nevertheless, the output PKA of the NAND gate 25 is sustained at the "H" level because the D-FF circuit 22 remains preset. Accordingly, the output of the OR gate 27 goes high on the trailing edge of the output PKB of the NAND gate 26 and remains at the "H" level for one period of the reference clock signal $\phi_0$.

As described above, the input peak pulse signal Pin goes high while the reference clock signal $\phi_0$ is at the "L" or "H" level, causing the output of either the NAND gate 25 or 26 to turn to the "L" level for one period of the reference clock signal $\phi_0$. While the output of the NAND gate 25 or 26 is at the "L" level, the OR gate 27 is outputting an "H" pulse.

The pulse output by the OR gate 27 is fed to the D-FF circuit 28 to be sampled and then held therein with the timing set by the reference clock signal $\phi_0$. A pulse produced by the OR gate 27 from the output of the NAND gate 25 goes high on the rising edge of a reference clock pulse $\phi_0$. In the case of such a pulse, the synchronized peak pulse PK appearing at the Q-output pin of the D-FF circuit 28 will lag behind the output PKA of the NAND gate 25 by one period of the reference clock signal $\phi_0$. A pulse produced by the OR gate 27 from the output of the NAND gate 26, on the other hand, goes high on the trailing edge of a reference clock pulse $\phi_0$. In the case of such a pulse, the synchronized peak pulse PK appearing at the Q-output pin of the D-FF circuit 28 will lag behind the output PKB of the NAND gate 26 by half the period of the reference clock signal $\phi_0$.

The fact that the synchronized peak pulse signal PK lags behind the output PKA or PKB gives rises to a sampling error, the magnitude of which is determined by the phase relation between the input peak pulse signal Pin and the reference clock signal $\phi_0$ as follows. In the case of an input peak pulse Pin rising with a reference clock pulse $\phi_0$ set at the "L" level, or an input peak pulse Pin going high before a rising edge of a reference clock pulse $\phi_0$, the sampling error has a value in the range 1 to 1.5 times the period of the reference clock signal $\phi_0$. In the case of an input peak pulse Pin rising with a reference clock pulse $\phi_0$ set at the "H" level, or an input peak pulse Pin going high after a rising edge of a reference clock pulse $\phi_0$, on the other hand, the sampling error has a value in the range 0.5 to 1 times the period of the reference clock signal $\phi_0$. Accordingly, the sampling error of the input peak pulse signal Pin has a value in the range 0.5 to 1.5 times the period of the reference clock signal $\phi_0$. As a result, no phase jitters appear in the synchronized peak pulse signal PK obtained in this way regardless of whether the phase of the input peak pulse signal Pin lags behind or leads ahead of the rising edge of the reference clock signal $\phi_0$.

Figure 5:
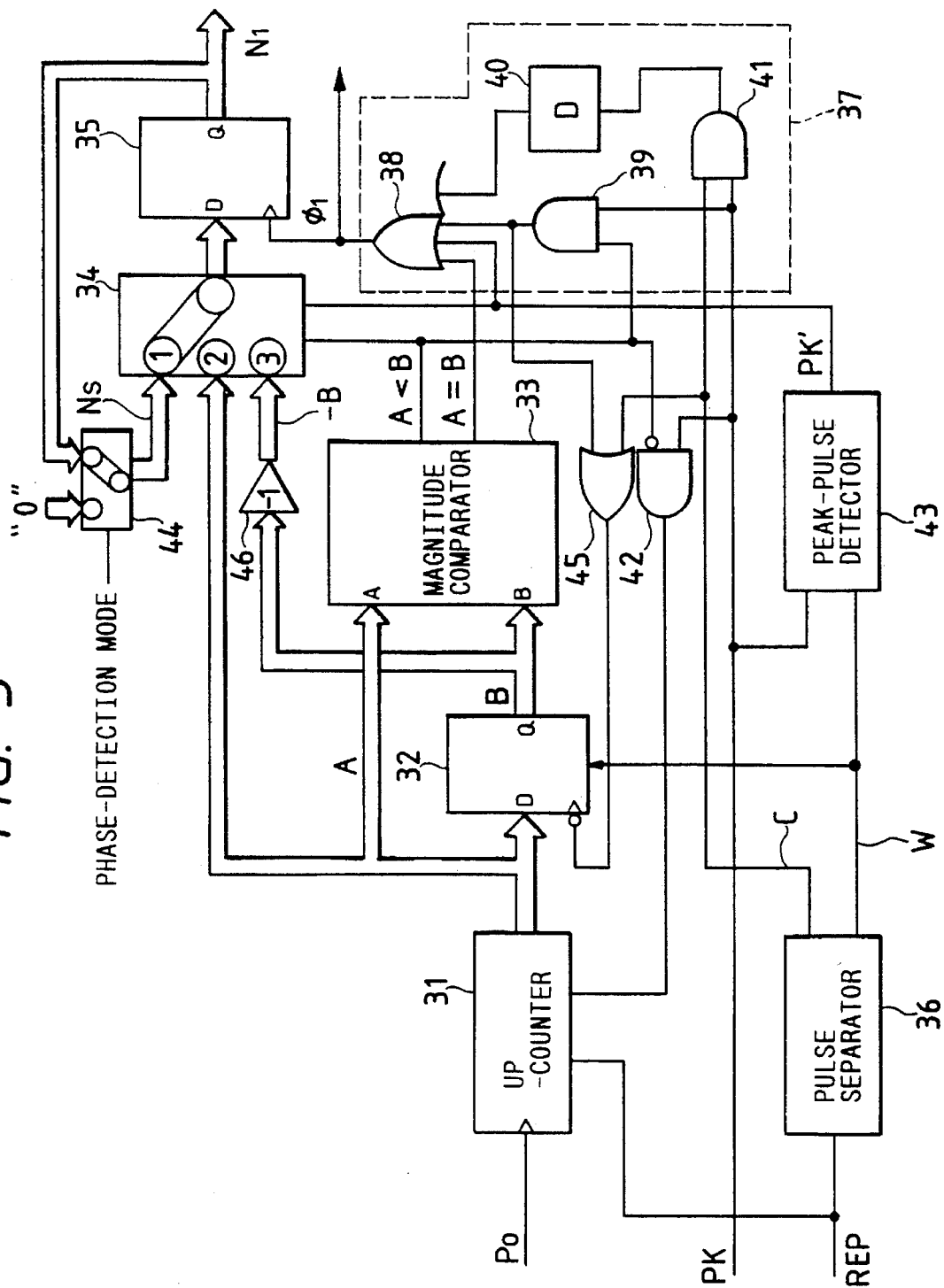
FIG. 5 shows a block diagram of an actual example of a phase detector employed in the embodiment shown in FIG. 1.

FIG. 5 shows a block diagram of an actual example of the phase detector 3 employed in the embodiment shown in FIG. 1. Reference numeral 31 shown in the figure is an up-counter whereas reference numeral 32 denotes a D-FF circuit. Reference numerals 33 and 34 denote a magnitude comparator and a selector respectively. Reference numeral 35 is a D-FF circuit and reference numeral 36 is a pulse separator. Reference numerals 37 and 38 denote a phase-difference output clock generator and an OR gate respectively. Reference numeral 39 is an AND gate whereas reference numeral 40 denotes a delay circuit. Reference numerals 41 and 42 each denote an AND gate. Reference numerals 43 and 44 are a peak-pulse detector and a selector respectively. Reference numeral 45 denotes an OR gate and reference numeral 46 is a multiplier.

FIG. 6 to 10 show timing charts of a variety of signals generated in the phase detector 3 shown in FIG. 5. The same notations as those shown in FIG. 5 are used in FIGS. 6 to 10 to denote the same signals.

The up-counter 31 shown in FIG. 5 up-counts the number of reference clock pulses $\phi_0$. The up-counter 31 is preset to a value of unity by a comparison pulse C or a reference pulse W of the comparison-reference pulse signal REP supplied by the synchronized circuit 2 shown in FIG. 1. The contents of the up-counter 31 are cleared to zero when the synchronized peak pulse signal PK is supplied thereto through the AND gate 42. In this example, a difference in phase between a comparison pulse C of the comparison-reference pulse signal REP and the closest synchronized peak pulse PK is measured.

The comparison-reference pulse signal REP is also fed to the pulse separator 36 to be split into a train of comparison pulses C and a train of reference pulses W. A count value A output by the up-counter 31 is sampled and then held by the D-FF circuit 32 with timing determined by a comparison pulse C or the output of the AND gate 39 which are supplied to the D-FF circuit 32 through the OR gate 45. The D-FF circuit 32 is preset to a value of −1 by a reference pulse W supplied by the pulse separator 36. A count value B held by the D-FF circuit 32, which is also known as a hold value, represents a range of detection for synchronized peak pulses PK leading ahead of comparison pulses C.

The magnitude comparator 33 compares the magnitude of the count value A output by the up-counter 31 to that of the hold value B held by the D-FF circuit 32, outputting an "H" (high-level) signal for A<B or another "H" (high-level) signal for A=B. The former denotes that A<B whereas the latter indicates that A≈B. Controlled by the "A<B" signal output by the magnitude comparator 33, the selector 34 selects an input terminal ② for signal periods in which A<B or an input pin ③ for other periods. As shown in the figure, the input terminal ② receives the count value A output by the up-counter 31 whereas the input pin ③ receives a quantity −B output by the multiplier 46. With a pseudo synchronized peak pulse PK' supplied to the selector 34 from the peak-pulse detector 43, however, the selector 34 selects an input pin ① for the very same period of the pseudo synchronized peak pulse PK'. As shown in the figure, the input pin ① receives a signal Ns output by the selector 44. As will be described later, the peak-pulse detector 43 generates a pseudo synchronized peak pulse PK' for each missing synchronized peak pulse PK.

A signal forwarded by the selector 34 is supplied to the D-FF circuit 35 to be latched there with timing determined by a phase-difference output clock signal $\phi_1$ generated by the phase-difference output clock generator 37. Measurement data $N_1$ appears at the Q output of the D-FF circuit 35, representing a difference in phase between a synchronized peak pulse PK and a comparison pulse C.

The selector 44 selects a difference in phase in the event of a missing input peak pulse Pin or in case no input peak pulse Pin exists in the phase range. Depending upon the phase-comparison mode, the selector 44 selects either a value of 0 for the period time of a pseudo synchronized peak pulse PK' or the same measurement data $N_1$ output by the D-FF circuit 35. The selected data is supplied through the selector 34 to the D-FF circuit 35 to be held therein. The D-FF circuit 35 therefore outputs a value of 0 or reoutputs the previous measurement data $N_1$ to indicate a difference in phase between a synchronized peak pulse PK and a comparison pulse C.

Next, operations of this example are explained by referring to diagrams for the following three cases:

a. The value of the difference in phase between a synchronized peak pulse PK and a comparison pulse C is negative, zero or positive.
b. A noise pulse is introduced in the input peak pulse signal Pin, causing an unwanted pulse to exist in the synchronized peak pulse signal PK.
c. A pulse is missing from the input peak pulse signal Pin, causing a pulse to disappear from the synchronized peak pulse signal PK.

It should be noted, however, that it is assumed that the comparison pulses C and the reference pulses W are supplied to alternate with each other at intervals of three periods of the reference clock signal $\phi_0$. Accordingly, the period of synchronized peak pulse signal PK is six times the length of the period of the reference clock signal $\phi_0$.

(1) The value of the difference in phase between a synchronized peak pulse PK and a comparison pulse C is negative.

Figure 6:
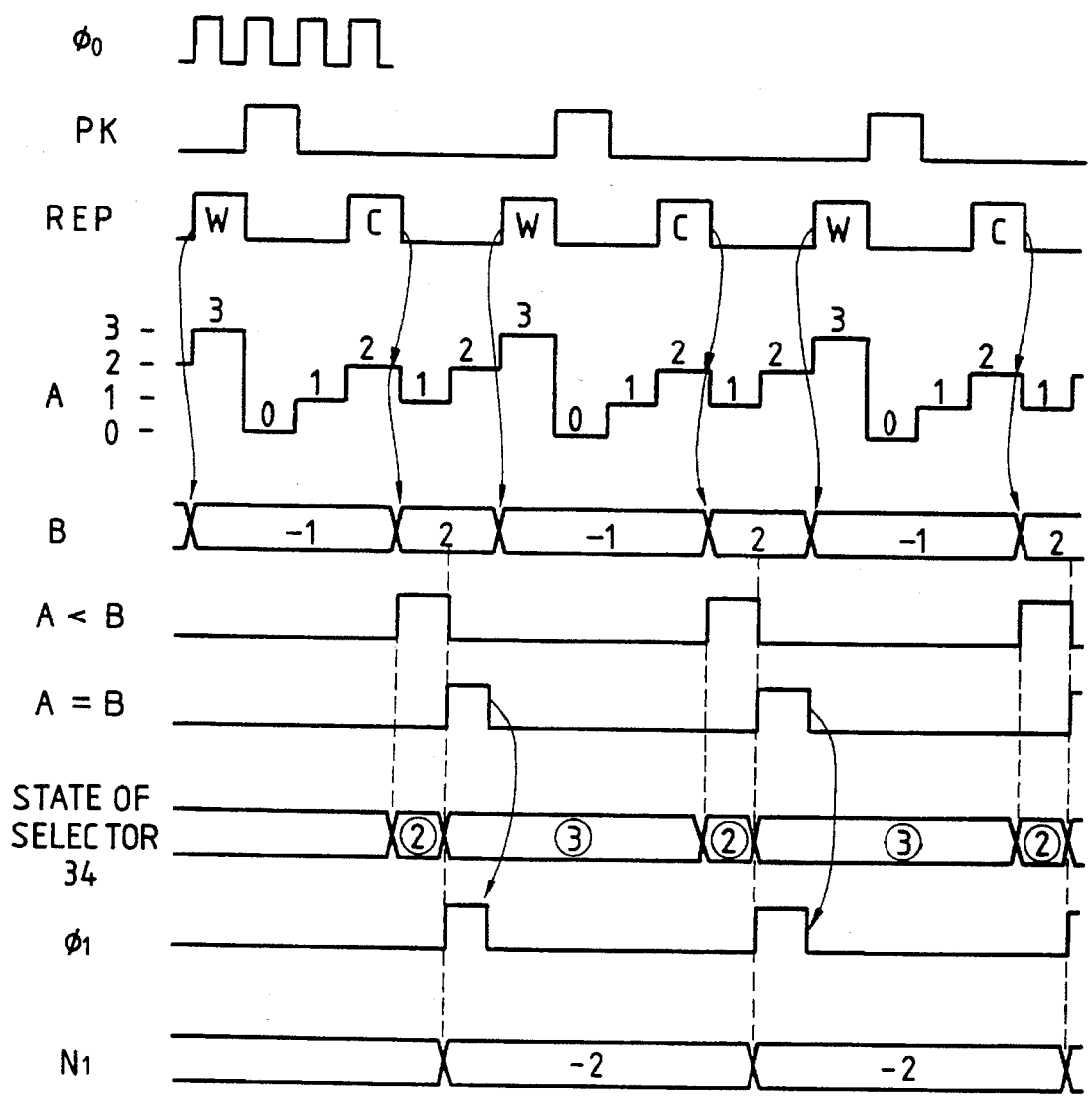
FIG. 6 shows timing charts for an operation of the phase detector shown in FIG. 5.

In this case, the phase of the synchronized peak pulse signal PK leads ahead of that of the comparison pulse signal C. Assume that the comparison pulse signal C lags behind the synchronized peak pulse signal PK by two periods of the reference clock signal $\phi_0$ as shown in FIG. 6. Accordingly, the reference pulse signal W leads ahead of the synchronized peak pulse signal PK by one period of the reference clock signal $\phi_0$.

First of all, the D-FF circuit 32 is preset to a value of −1 by a reference pulse W output by the pulse separator 36 as shown in the figure. Accordingly, the hold value B thereof is also −1. Then, the contents of the up-counter 31 are once cleared to zero by a synchronized peak pulse PK. Afterwards, the contents are incremented by one for each reference clock pulse $\phi_0$. The magnitude comparator 33 compares the count value A of the up-counter 31 to the hold value B of the D-FF circuit 32. In this case, the magnitude comparator 33 does not go out signal since A>B.

Thereafter, comparison pulses C generated by the pulse separator 36 are supplied to the D-FF circuit 32 as a clock signal through the OR gate 45 to provide timing with which the count value A of the up-counter 31 is held in the D-FF circuit 32. At that time, the count value A of the up-counter 31 is 2. Accordingly, the hold value B of the D-FF circuit 32 is also 2. In this way, a comparison pulse C causes the D-FF circuit 32 to carry out a hold operation, allowing the magnitude comparator 33 to repeat comparison.

Here, the magnitude comparator 33 compares the hold value B with a value of 2 from the D-FF circuit 32 to the current count A of the up-counter 31. Since the up-counter 31 has been preset to a value of 2 by a comparison pulse C as described above, the outcome of comparison produced by the magnitude comparator 33 is A<B, resulting in a "H" (high-level) "A<B" signal which is supplied to the AND gate 39 and the selector 34. The "A<B" signal is also fed to the AND gate 42 after being inverted. As described earlier, the selector 34 selects the input pin ② as long as the "A<B" signal is held at the high level. As the contents of the up-counter are incremented by a next reference clock pulse $\phi_0$, however, the count value A becomes equal to the hold value B (A=B), causing the magnitude comparator 33 to output a "A=B" signal to replace the "A<B" signal. Accordingly, the selector 34 now selects the input pin ②. In this case, the sign of the hold value B of the D-FF circuit 32 is inverted by the multipiler 46 to produce an inverted hold value −B with a value of −2 which is then supplied to the D-FF circuit 35.

The "A=B" signal is also fed to the D-FF circuit 35 as the phase-difference output clock signal $\phi_1$ through the OR gate 38 of the phase-difference output clock generator 37. The D-FF circuit 35 holds the inverted hold value −B having a value of −2 with timing set by the phase-difference output clock signal $\phi_0$. The measurement data $N_1$ representing a difference in phase between the synchronized peak pulse signal PK and the comparison-reference pulse signal REP thereby has a value of −2. Later on, as a next reference pulse W is output by the pulse separator 36, presetting the D-FF circuit 32 to a value of −1 and, thus, setting the hold value B also to a value of −1, the above operation is repeated.

As shown in FIG. 6, the above operation is executed repeatedly to hold the measurement data $N_1$ at a value of −2 as long as the difference in phase between the synchronized peak pulse signal PK and the reference pulse signal W remains at the above value. As will be described later, however, the phase of the reference pulse signal W is shifted forward in accordance with the value of the measurement data $N_1$. At the same time, the value of the measurement data $N_1$ is incremented to −1 and, finally, to 0 for which, the phase of the synchronized peak pulse signal PK matches the phase of the comparison pulse signal C. It should be noted that the measurement data $N_1$ and the phase-difference output clock signal $\phi_1$ produced by the phase-difference output clock generator 37 are both supplied to the LPF 1 shown in FIG. 5.

(2) The value of the difference in phase between a synchronized peak pulse PK and a comparison pulse C is positive.

Figure 7:
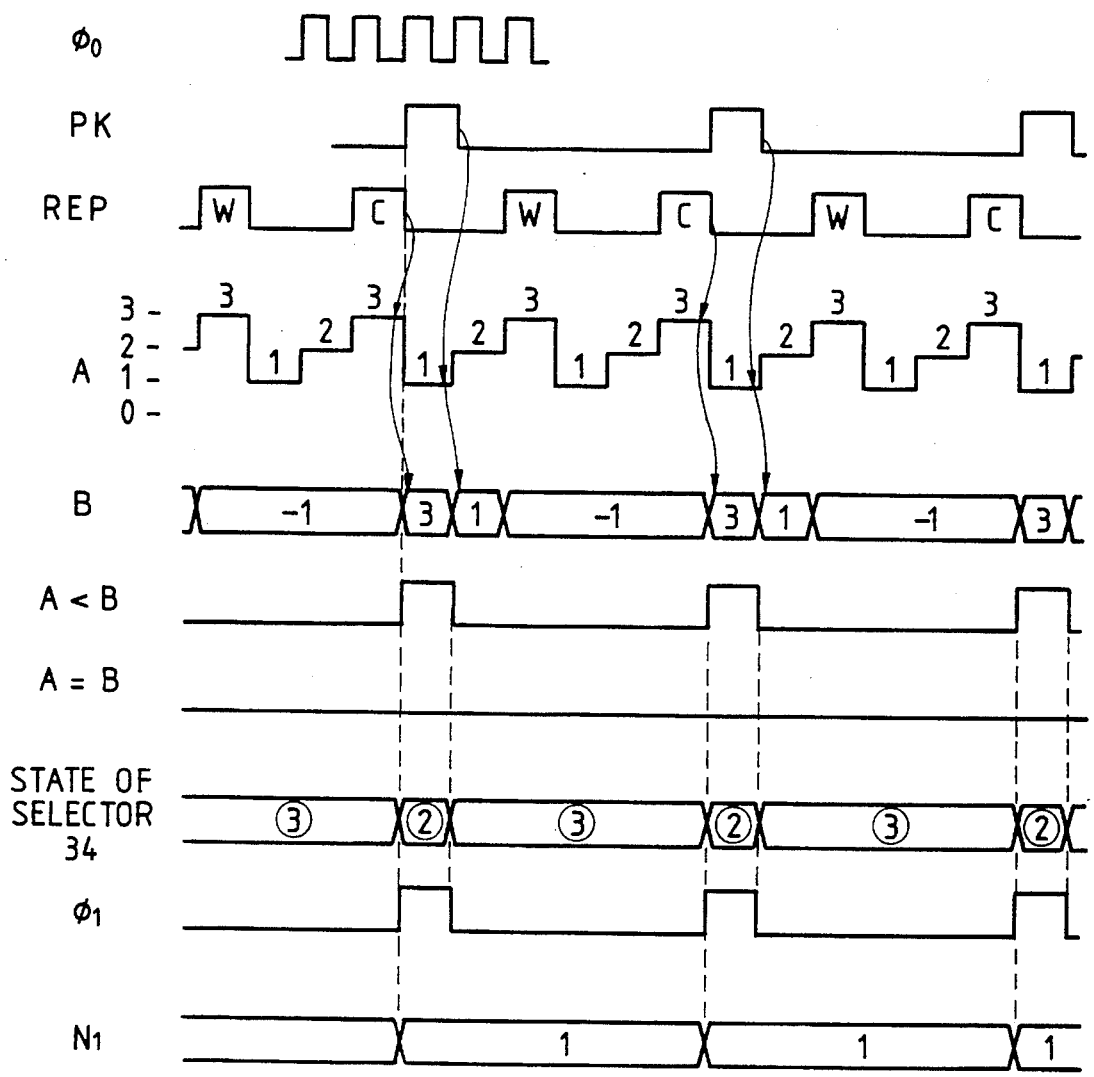
FIG. 7 shows timing charts for another operation of the phase detector shown in FIG. 5.

In this case, the phase of the synchronized peak pulse signal PK lags behind that of the comparison pulse signal C. Assume that the comparison pulse signal C leads ahead of the synchronized peak pulse signal PK by one period of the reference clock signal $\phi_0$ as shown in FIG. 7.

First of all, the D-FF circuit 32 is preset to a value of −1 by a reference pulse W output by the pulse separator 36 as shown in the figure. Accordingly, the hold value B thereof is also −1. Then, the contents of the up-counter 31 are once preset to a value of unity on the rising edge of a reference pulse W. Afterwards, the contents are incremented by unity for each reference clock pulse $\phi_0$. The magnitude comparator 33 compares the count value A of the up-counter 31 to the hold value B of the D-FF circuit 32. In this case, the magnitude comparator 33 does not go out signal since A>B.

Thereafter, comparison pulses C generated by the pulse separator 36 are supplied to the D-FF circuit 32 as a clock signal through the OR gate 45 to provide timing with which the count value A of the up-counter 31 is held in the D-FF circuit 32. At that time, the count value A of the up-counter 31 is 3. Accordingly, the hold value B of the D-FF circuit 32 is also 3.

Here, the magnitude comparator 33 compares the hold value B having a value of 3 from the D-FF circuit 32 to the current count A of the up-counter 31. Since the up-counter 31 has been preset to a value of unity by a comparison pulse C as described above, the outcome of comparison produced by the magnitude comparator 33 is A<B, resulting in a "H" (high-level) "A<B" signal which is supplied to the AND gate 39 and the selector 34. The "A<B" signal is also fed to the AND gate 42 after being inverted. As described earlier, the selector 34 selects the input pin ② as long as the "A<B" signal is kept at the high level. At that time, the synchronized peak pulse signal PK is fed to the D-FF circuit 35 as the phase-difference output clock signal $\phi_1$ through the AND gate 39 and the OR gate 38 of the phase-difference output clock generator 37. Accordingly, the D-FF circuit 35 holds the count value A with a value of unity output by the up-counter 31.

As shown in FIG. 7, the above operation is executed repeatedly to hold the measurement data $N_1$ at a value of unity as long as the difference in phase between the synchronized peak pulse signal PK and the comparison pulse signal C remains at the above value.

(3) The value of the difference in phase between a synchronized peak pulse PK and a comparison pulse C is zero.

Figure 8:
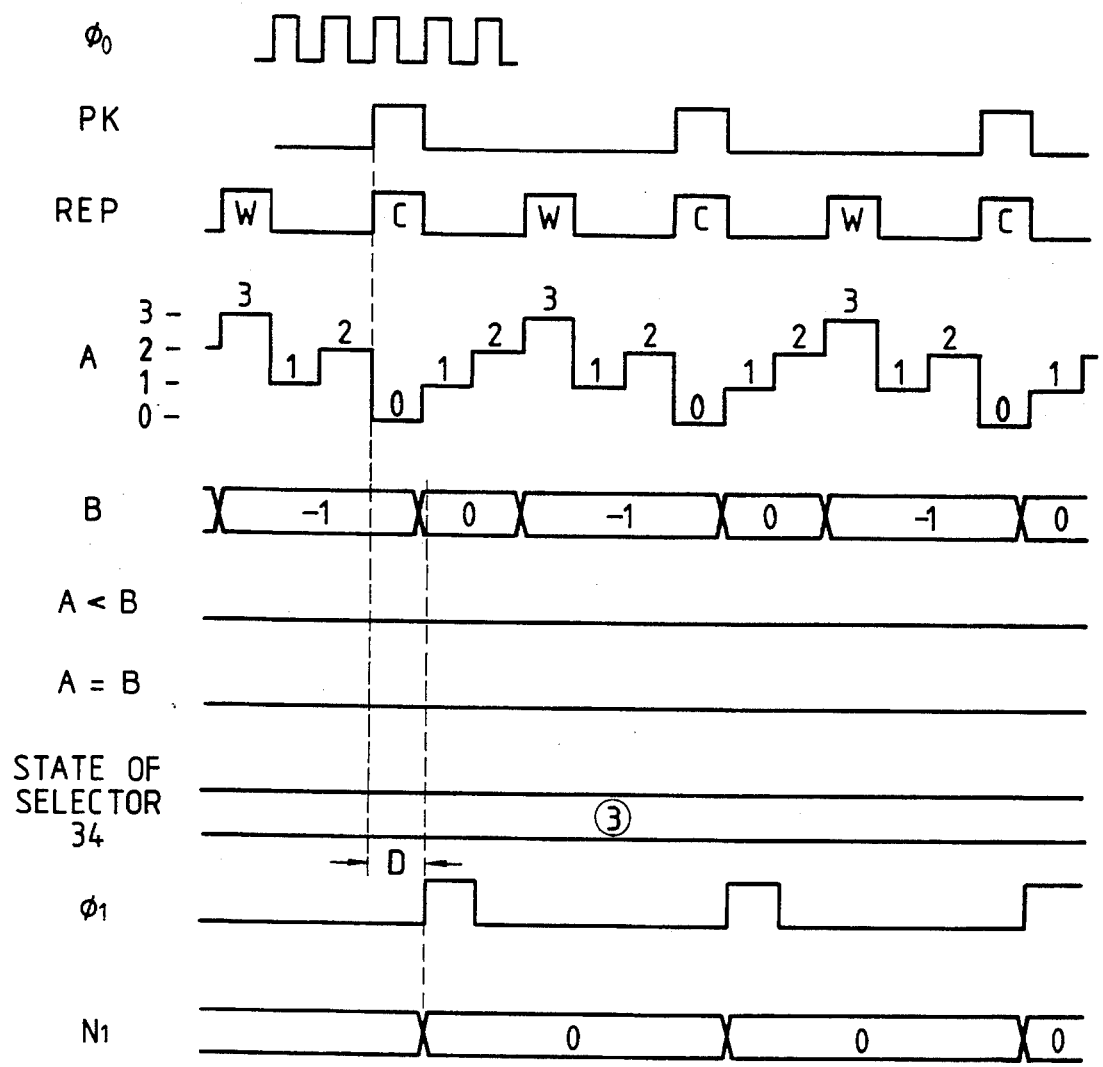
FIG. 8 shows timing charts for further another operation of the phase detector shown in FIG. 5.
Figure 9:
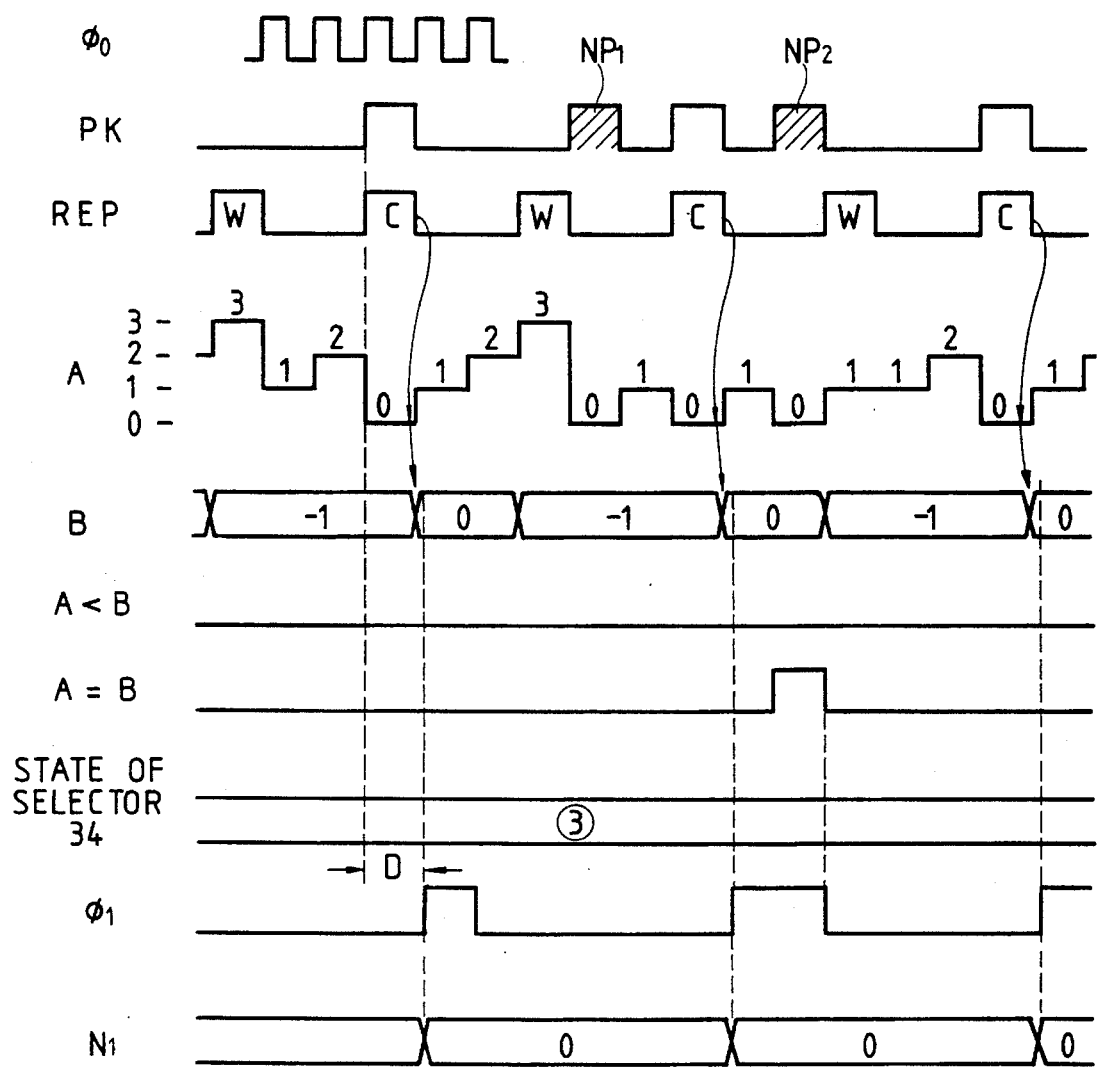
FIG. 9 shows timing charts for still further another operation of the phase detector shown in FIG. 5.

In this case, the phase of the synchronized peak pulse signal PK matches that of the comparison pulse signal C as shown in FIG. 8.

First of all, the D-FF circuit 32 is preset to a value of $-1$ by a comparison pulse C output by the pulse separator 36 as shown in the figure. Accordingly, the hold value B thereof is also $-1$. Afterwards, the contents of the up-counter 31 are incremented by unity for each reference clock pulse $\phi_0$. The magnitude comparator 33 compares the count value A of the up-counter 31 to the hold value B of the D-FF circuit 32. In this case, no signal is output since A>B.

Later, comparison pulses C are generated by the pulse separator 36 and, at the same time, synchronized peak pulses PK are input. Since the magnitude comparator 33 does not assert the "A<B" signal, the synchronized peak pulse signal PK is supplied to the up-counter 31 through the AND gate 42. The up-counter 31 is thereby cleared to zero. Immediately after the up-counter 31 is cleared to zero, a comparison pulse C is fed to the D-FF circuit 32 as a clock signal through the OR gate 45. With the timing of this comparison pulse C, the count value A of the up-counter 31 which has been cleared to zero is held in the D-FF circuit 32 as the hold value B.

Here, the magnitude comparator 33 compares the hold value B having a value of 0 from the D-FF circuit 32 to the current count A of the up-counter 31. Since the count value A is incremented from unity, the relation A>B holds. In this case, no signal is output by the magnitude comparator 33. Accordingly, the selector 34 selects the input pin ②. In this case, the multiplier 46 multiplies the hold value B of the D-FF circuit 32 by a coefficient of $-1$ to yield a zero which is then supplied to the D-FF circuit 35.

On the other hand, the synchronized peak pulse signal PK, which has the same phase as the comparison pulses C, is fed to the delay circuit 40 through the AND gate 41 of the phase-difference output clock generator 37. Delayed by a predetermined time D in the delay circuit 40, the synchronized peak pulse signal PK goes through the OR gate 38 to become the phase-difference output clock signal $\phi_1$ which is then supplied to the D-FF circuit 35. Accordingly, the value 0 selected by the selector 34 is thereby held by the D-FF circuit 35 as the measurement data $N_1$ which has a value of 0 too. The above operation is repeated to give measurement data $N_1$ having a value of 0 appearing at the output of the D-FF circuit 35 as long as the phase of the synchronized peak pulse signal PK matches that of the comparison pulse signal C.

It is obvious from the above description with reference to FIGS. 6 to 8 that the count value $N_1$ obtained from the D-FF circuit 35 has a value which represents the phase of the synchronized peak pulse signal PK, with the comparison pulses C taken as a reference, in terms of periods of the reference clock signal $\phi_0$. The plus and minus signs of the count value $N_1$ indicate that the synchronized peak pulse signal PK lags behind and leads ahead of the comparison pulse signal C respectively. In the example given above, the maximum phase shift of the synchronized peak pulse signal PK relative to the comparison pulses C is three periods of the reference clock pulse signal $\phi_0$. In this case, the synchronized peak pulse signal PK has the same phase as the reference pulses W and the measurement data $N_1$ has a value of $-3$.

(4) Unwanted pulses exist in the synchronized peak pulse signal PK. This case is explained by referring to FIG. 9. Unwanted pulses shown as striped rectangulars in the figure are introduced in the synchronized peak pulse signal PK which has the same phase as the comparison pulses C. As shown in the figure, an unwanted pulse NP1 exists between a reference pulse W and a succeeding reference pulse C and another unwanted pulse NP2 is introduced between the reference pulse C and a succeeding pulse W.

For portions with no unwanted pulses, the operation shown in FIG. 8 is executed repeatedly. The unwanted pulse NP1 appearing after the reference pulse W is supplied to the up-counter 31 through the AND gate 42 because, at that time, the hold value B of the D-FF circuit 32 has a value of $-1$, causing the magnitude comparator 33 to assert no signal. The unwanted pulse NP1 clears the contents of the up-counter 31 to a value of 0. However, the hold value B retained in the D-FF circuit 32 remains the same. Therefore, the magnitude comparator 33 does not assert a signal, keeping the selector 34 selecting the input pin ③ as it is.

Next, the pulse separator 43 outputs the succeeding pulse C. At the same time, a correct synchronized peak pulse PK is input. This synchronized peak pulse PK is supplied to the up-counter 31, clearing the contents thereof to zero. Immediately after the contents of the up-counter 31 are cleared to zero, the count value A, i.e. the cleared contents of the up-counter 31, is held in the D-FF circuit 32 with timing set by the succeeding comparator pulse C. Accordingly, the value of the hold value B held in the D-FF circuit 32 also becomes zero as well.

The contents of the up-counter 31 are then incremented to unity. At the same time, a synchronized peak pulse PK, which has the same phase as the comparison pulses C, is fed to the delay circuit 40 through the AND gate 41 of the phase-difference output clock generator 37. Delayed by a predetermined time D in the delay circuit 40, the synchronized peak pulse PK goes through the OR gate 38 to become the phase-difference output clock signal $\phi_1$. The unwanted pulse NP2 further appears, clearing the contents of the up-counter 31 back to zero. Therefore, the count value A becomes equal to the hold value B (A=B), causing the magnitude comparator 33 to assert the "A=B" signal which is supplied to the OR gate 38 of the phase-difference output clock generator 37. Timing-wise, the "A=B" signal partially overlaps the synchronized peak pulse PK which has been delayed by the delay circuit 40. Accordingly, a value of 0 output by the multiplier 46 is held by the D-FF circuit 35 on the rising edge of the pulse. As a result, the measurement data $N_1$ is also zero.

In the operation described above, a phase-difference output clock pulse $\phi_1$ is always obtained from a comparison pulse C having the same phase as the correct synchronized peak pulse PK as in the case with the operation illustrated in FIG. 8 even if an unwanted pulse is introduced before or after the correct synchronized peak pulse PK. At time slots outside a comparison pulse C, however, the phase-difference clock pulse signal $\phi_1$ is not generated. At such time slots, the selector 34 selects the output $-B$ of the multiplier 46, ignoring the effects of an unwanted pulse. Accordingly, the measurement data $N_1$ with a correct value of 0 is obtained.

In the example described above, the synchronized peak pulse signal PK has the same phase as the comparison pulses C. With their phases different from each other, a correct synchronized peak pulse PK closer to a comparison pulse C than the unwanted pulse will always result in measurement data $N_1$ having a value correctly representing their phase difference.

(5) A synchronized peak pulse is missing.

Figure 10:
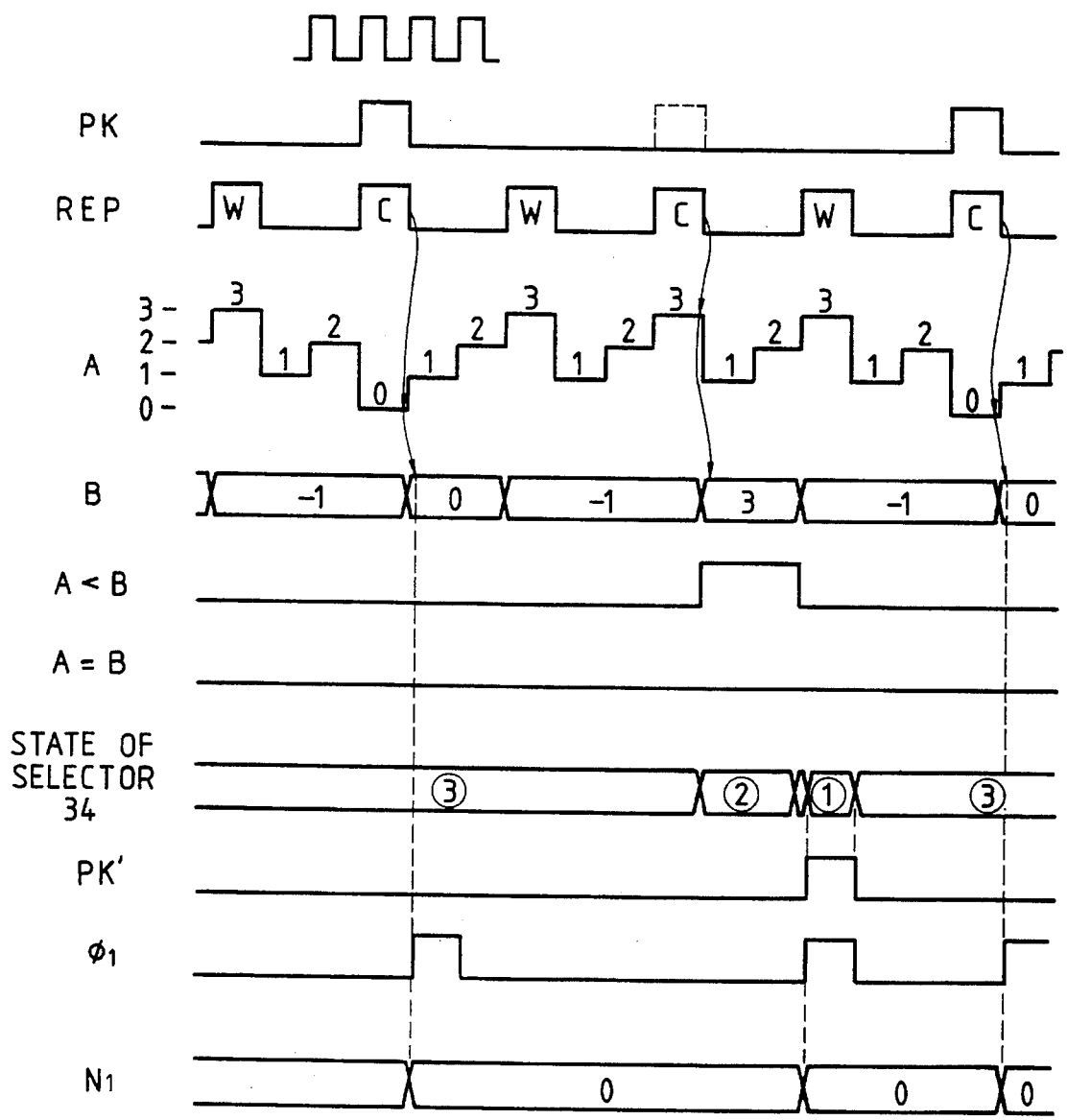
FIG. 10 shows timing charts for yet another operation of the phase detector shown in FIG. 5.

This case is explained by referring to FIG. 10. A pulse shown as a rectangular with dashed-line sides in the figure is missing from the synchronized peak pulse signal PK which has the same phase as the comparison pulses C.

For portions of the synchronized peak pulse signal PK with no missing pulse, that is, for portions in which a synchronized peak pulse PK is input at the same time as a comparison pulse C is output by the pulse separator 36, the operation shown in FIG. 8 is executed repeatedly. A pulse indicated by the rectangular with dashed-line sides is missing from the synchronized peak pulse signal PK at the time a comparison pulse C is output by the pulse separator 36 following a reference pulse W. The count value A of the up-counter 31 which then has a value of 3 is held by the D-FF circuit 32 as the hold value B and the contents of the up-counter 31 are preset to a value of unity with timing set by the comparison pulse C. Since the hold value B is 3, the magnitude comparator 33 asserts the "A<B" signal during periods of time in which the count value A of the up-counter 31 is 1 and then incremented to 2. Accordingly, the selector 34 selects the count value A of the up-counter 31 supplied to the input pin ②. At that time, the phase-difference output clock generator 37 does not produce the phase-difference output clock signal $\phi_1$. Accordingly, the count value A is not held in the D-FF circuit 35. That is to say, when a pulse which should coincide with the comparison pulse C is missing from the synchronized peak pulse signal PK, the magnitude comparator 33 asserts the "A<B" signal, merely switching the selector 34 to the input pin ② temporarily. As a result, the measurement data $N_1$ held by the D-FF circuit 35 remains unchanged at a value of 0.

On the other hand, the synchronized peak pulse signal PK and the reference pulse signal W are supplied to the peak-pulse detector 43. The peak-pulse detector 43 keep checking whether or not a synchronized peak pulse PK exists between a reference pulse W currently being supplied and a previous reference pulse W fed one period before. If no synchronized peak pulse PK is detected, a pseudo synchronized peak pulse PK' is output. While the pseudo synchronized peak pulse PK' is being asserted, the selector 34 is switched to select the measurement data $N_1$ supplied by the D-FF circuit 35 to the input pin ② through the selector 44 which is selecting the measurement data $N_1$. The pseudo synchronized peak pulse PK' is supplied to the D-FF circuit 35 as a phase-difference output clock pulse $\phi_1$ through the OR gate 38 of the phase-difference output clock generator 37. The D-FF circuit 35 thereby holds the signal Ns having a value 0 which is output by the selector 44 through the selector 34.

As described above, the measurement data $N_1$ with a predetermined value of 0 is obtained from the D-FF circuit 35 without being affected by a missing synchronized peak pulse PK.

It should be noted that, in the example described above, the synchronized peak pulse signal PK has the same phase as the comparison pulses C. Even if their phases are different from each other, the measurement data $N_1$ having a value representing their phase difference can be obtained from the D-FF circuit 35 without being affected by a missing synchronized peak pulse PK in the same way as the example described above.

In the examples described so far, the maximum difference in phase between the synchronized peak pulse signal PK and the comparison pulses C is three times the period of the reference clock signal $\phi_0$, giving rise to no particular problem. The phase detector can be designed so the peak-pulse detector 43 outputs a pseudo synchronized peak pulse PK' for performing the above operation in case a synchronized peak pulse signal PK or a comparison-reference pulse signal REP has a period resulting in a maximum difference in phase sufficiently greater than the three reference-clock periods or in the event of an abnormal difference in phase between the synchronized peak pulse signal PK and the comparison pulse signal C.

In addition, the phase detector can also be designed so that a synchronized peak pulse PK not detected in a predetermined number of periods of the reference pulse signal W is judged as a non-phase-comparison mode in which the selector 44 selects a value of 0. In this case, a phase-difference output pulse $\phi_1$ generated from a pseudo synchronized peak pulse PK' produced by the peak-pulse detector 43 for every reference pulse W causes the D-FF circuit 35 to hold the output Ns of the selector 44 having a value of 0 and to display the measurement data $N_1$ also with a value of 0.

As described so far, the phase detector 3 shown in FIG. 5 provides measurement data $N_1$ always correctly representing a different in phase between the synchronized peak pulse signal PK and the comparison pulse signal C without being affected by a noise pulse or a pulse missing from the synchronized peak pulse signal PK.

Figure 11:
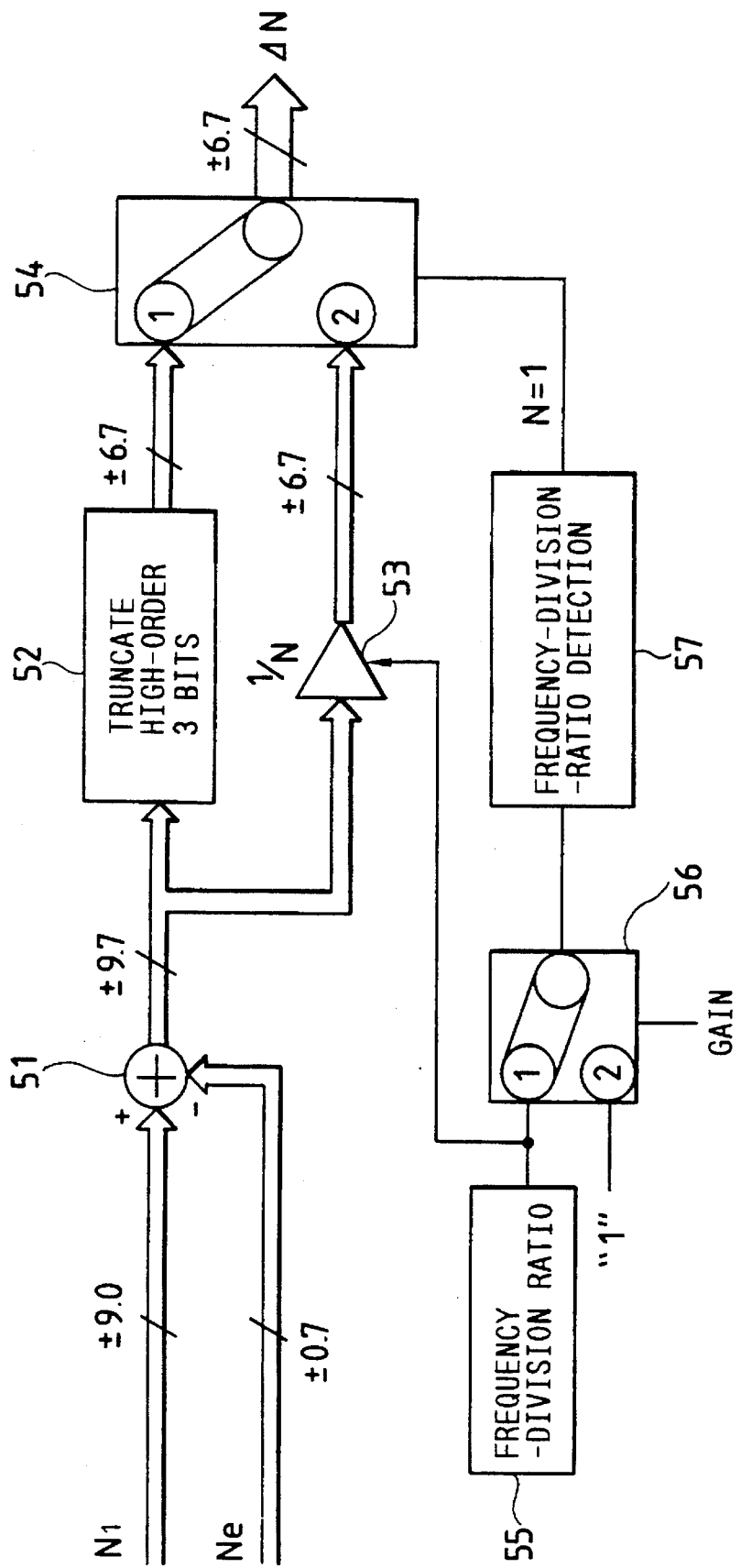
FIG. 11 shows a block diagram of an actual example of a subtractor employed in the embodiment shown in FIG. 1.

FIG. 11 shows a block diagram of an example of the subtractor 4 employed in the embodiment shown in FIG. 1. Reference numeral 51 shown in the figure denotes an adder whereas reference numeral 52 is a high-order bit truncater. Reference numerals 53 and 54 denote a multiplier and a selector respectively. Reference numeral 55 is a frequency-division ratio memory unit and reference numeral 56 denotes a selector. Reference numeral 57 is a frequency-division ratio detector.

As briefly mentioned in the description of the embodiment shown in FIG. 1, the subtractor 4 subtracts error data Ne output by the register 13 shown in FIG. 1 from the measurement data $N_1$ produced by the phase detector 3 to give an internal phase error ΔN. During the subtraction, the number of bits of the internal phase error ΔN is reduced as follows.

As described before, the maximum value of the measurement data $N_1$ is proportional to the period of the synchronized peak pulse signal PK. Accordingly, a greater maximum value is resulted in when comparing the phase of the comparison-reference signal REP passing through the two-frequency-divider 17. That is to say, when explaining the embodiment shown in FIG. 1, the frequency of the comparison-reference pulse signal REP is assumed to be not much different from that of the reference clock signal $\phi_0$ for the sake of convenience. In actuality, however, the frequency of the reference clock signal $\phi_0$ is much higher than that of the comparison-reference pulse signal REP. Thus, the number of bits in the measurement data $N_1$ obtained from the phase detector 3 is high. Such a number of bits are required if the measurement data $N_1$ is to be obtained with a high degree of accuracy. However, the high-order bits of the measurement data $N_1$ change only for a high-gain operation (lock in operation). In the case of a low-gain operation (following operation), the high-order bits do not change. On the contrary, the low-bits display an opposite behaviour. In addition, sacrificing the processing accuracy in a high-gain operation to a certain degree does not affect the PLL characteristic. Taking the above considerations into account, the number of bits of the processing result is decreased by truncating high-order bits for a low-gain operation or discarding low-order bits in the case of a high-gain operation.

Next, the operation of the example is described. In order to simplify the following description, the measurement data $N_1$ is assumed to be a signed integer comprising 9 bits (a sign and 9 bits before the decimal point) whereas the error data Ne is assumed to be signed fraction comprising 7 bits (a sign and 7 bits after the decimal point).

The adder 51 shown in FIG. 11 extends the measurement data $N_1$ with 7 fraction bits and the error data Ne with 9 interger bits to form data comprising a sign, 9 bits before the decimal point and 7 bits after the decimal point, performing subtraction on them. The subtraction result is supplied to the high-order bit truncater 52 and the multiplier 53. The high-order bit truncater 52 truncates the 3 highest-order bits from the measurement data $N_1$ comprising a sign, 9 bits before the decimal point and 7 bits after the decimal point to yield data comprising a sign, 6 bits before the decimal point and 7 bits after the decimal point. In the multiplier 53, the measurement data $N_1$ comprising a sign, 9 bits before the decimal point and 7 bits after the decimal point is multiplied by 1/N, where N is a frequency-division ratio to be described below, for reducing the number of bits in a result of multiplication comprising a sign, 6 bits before the decimal point and 7 bits after the decimal point.

On the other hand, the frequency-division ratio memory unit 55 is used for detecting and then storing the frequency-division ratio N of the two-frequency divider 17. Data representing the frequency-division ratio N is supplied to an input pin ① of the selector 56. As described above, the multiplier 53 multiplies the measurement data $N_1$ comprising a sign, 9 bits before the decimal point and 7 bits after the decimal point by 1/N. In addition, the selector 56 has an input pin ② to which data having a value of unity is supplied. Controlled by a gain switching signal, the selector 56 selects the input pin ① in a high-gain operation or the input pin ② in a low-gain operation. The frequency-division ratio detector 57 monitors the output of the selector 56 in order to check if the value of the frequency-division ratio N supplied by the frequency-division ratio memory unit 55 is unity or to check if the data with a value of unity is fed to the input pin ②. If data having a value of unity is detected, the frequency-division ratio detector 57 asserts its output to the "H" (high) level in order to request the selector 54 to select its input pin ① to which data comprising a sign, 6 bits before the decimal point and 7 bits after the decimal point is supplied from the high-order bit truncater 52. In other cases, the selector 54 selects its input pin ② to which data comprising a sign, 6 bits before the decimal point and 7 bits after the decimal point is supplied from the multiplier 53.

It is obvious from the above description that the output of the frequency-division ratio detector 57 is always set at the "H" level for a low-gain operation. In the case of a high-gain operation, the value of the frequency-division ratio N output by the frequency-division ratio memory unit 55 is other than unity, setting the signal output by the frequency-division ratio detector 57 to the "L" (low) level. In this way, the number of bits in a result obtained from the subtraction performed on the measurement data $N_1$ and the error data Ne from the register 13 shown in FIG. 1 is reduced to give an internal phase error ΔN. As a result, the LPF 5 shown in FIG. 1 needs to process only fewer bits.

It should be noted that for the sake of preserving generality in this example, a frequency-division ratio of unity is also taken into consideration even for a high-gain operation. If a frequency-division ratio of unity is not used in a high-gain operation, the selector 56 and the frequency-division ratio detector 57 are not required. In this case, the gain switching signal used for the selector 56 can be supplied directly to the selector 54 as its switching control signal. If the frequency-division ratio N is fixed at a value of unity even for a high-gain operation, on the other hand, it is not necessary to carry out the processing based on the gain to reduce the number of bits. Accordingly, the configuration of the subtractor 4 comprises only the adder 51.

Figure 12:
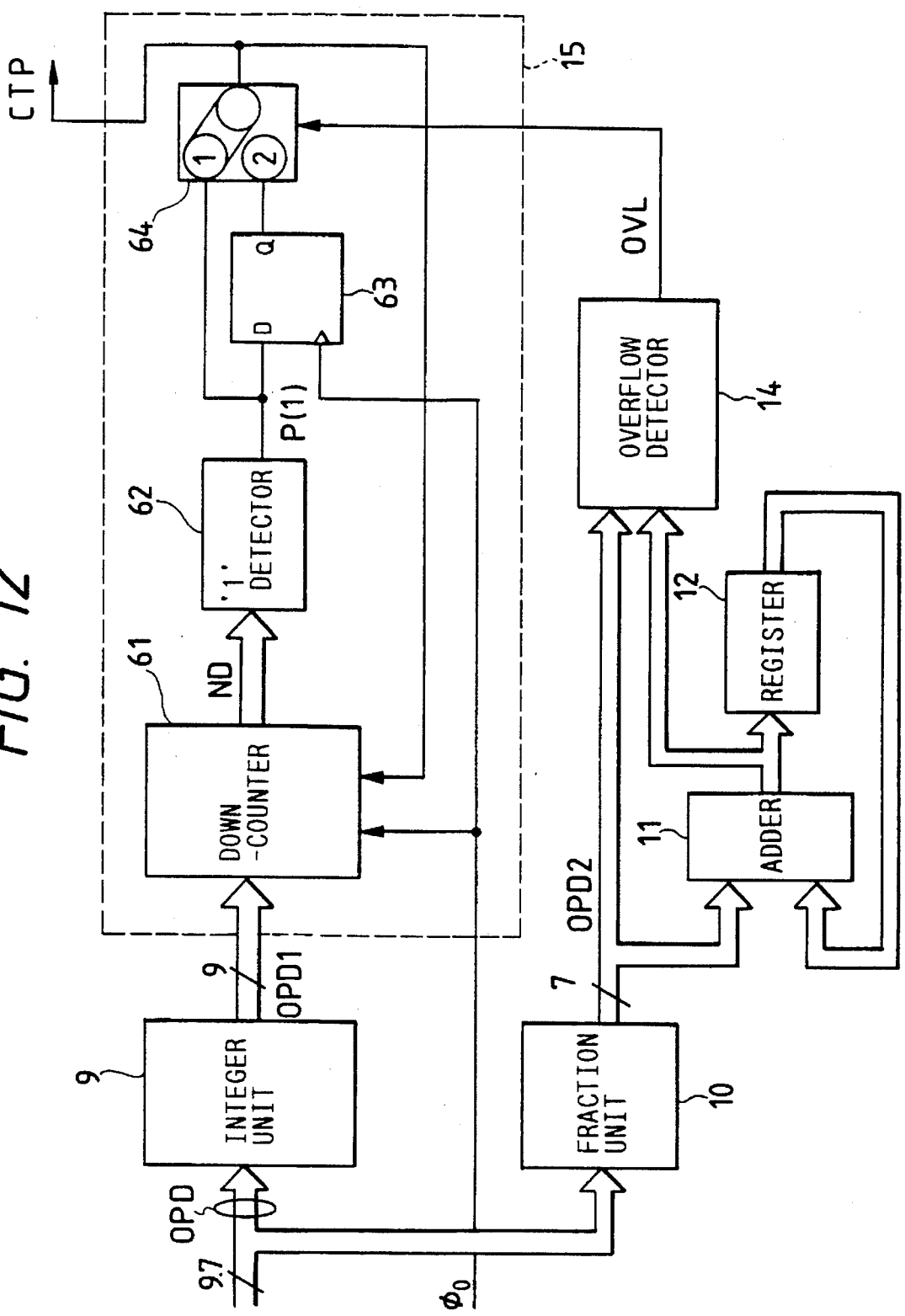
FIG. 12 shows a block diagram of an actual example of a counter and its related circuits employed in the embodiment shown in FIG. 1.

FIG. 12 shows a block diagram of an example of the counter 15 and its related circuits employed in the embodiment shown in FIG. 1. Reference numeral 61 shown in the figure denotes a down-counter whereas reference numeral 62 is a comparator/detector. Reference numerals 63 and 64 denote a D-FF circuit and a selector respectively. The same notations as those shown in FIG. 1 are used to denote the same components.

As shown in the figure, the counter 15 comprises the down-counter 61, the comparator/detector 62, the D-FF circuit 63 and the selector 64. As will be described later, the integer part OPD1 extracted by the integer unit 9 is loaded into the down-counter 61 each time a count pulse CTP is output. Thereafter, the contents of the down-counter 61 are decremented by one every time a reference clock pulse $\phi_0$ is supplied thereto. The comparator/detector 62 monitors the contents of the down-counter 61 which are referred to as a count value ND. The comparator/detector 62 outputs a "H" (high-level) pulse P(1) only when the count value ND becomes unity. The pulse P(1) is fed to an input pin ① of the selector 64. The pulse P is also supplied to the D-FF circuit 63 which is driven by the reference clock signal $\phi_0$. At the D-FF circuit 63, the pulse (1) is delayed by one period of the reference clock signal $\phi_0$ before being fed to an input pin ② of the selector 64. Controlled by a signal OVL output by the overflow detector 14, the selector 64 selects the input pin ① or ② when the output OVL is at the "L" (low) or "H" (high) level respectively.

Therefore, in order to output the count pulses CTP, the selector 64 normally selects the pulses P(1) which are output by the comparator/detector 61 with a period corresponding to the fraction part OPD1 loaded into the down-counter 62. When the overflow detector 14 detects an overflow, the selector 64 selects the delayed pulses output by the D-FF circuit 63 as described above. The delayed pulses are then output as the count pulses CTP. In either case, the integer portion OPD1 is loaded into the down-counter 61 with timing determined by a count pulse CTP. Accordingly, the period of the count pulses CTP is equal to (the value of OPD1–1)×$t_0$ or (the value of OPD1)×$t_0$ for a normal case or in the event of an overflow respectively, where $t_0$ is the period of the reference clock signal $\phi_0$.

Figure 13:
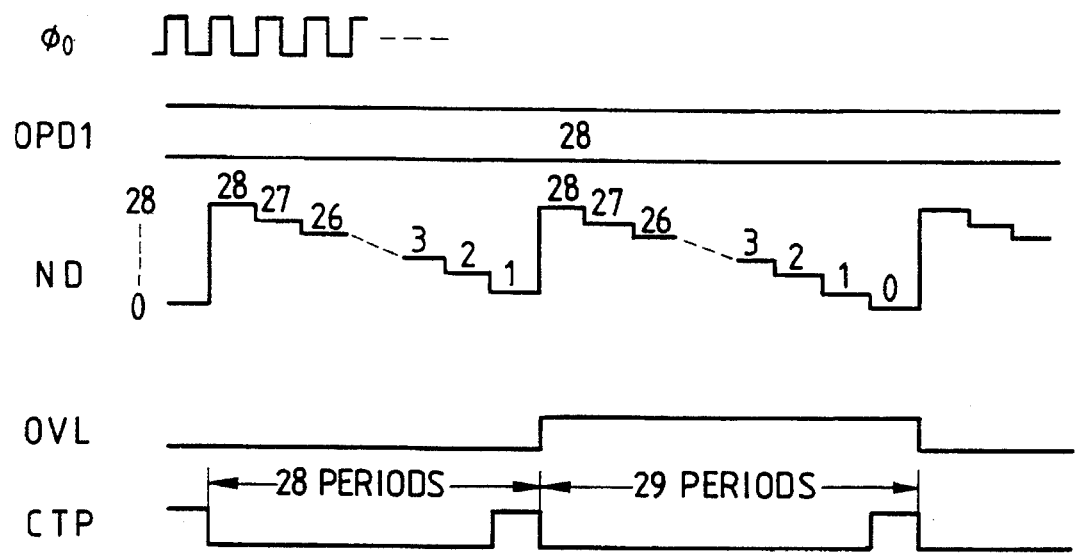
FIG. 13 shows operation timing charts of the counter shown in FIG. 12.

FIG. 13 shows operation timing charts of the counter 15 shown in FIG. 12. Let the value of the integer part OPD1 output by the integer unit 9 be 28 for example. With the overflow detector 14 outputting a "L" OVL signal, the period of the count pulses CTP is 28 times the period $t_0$ of the reference clock signal $\phi_0$. If the OVL signal is set at the "H" level, however, the period of the count pulses CTP is 29 times the period $t_0$ of the reference clock signal $\phi_0$ because the timing, with which the integer part OPD1 is loaded into the down-counter 61, is delayed by one period $t_0$ of the reference clock signal $\phi_0$. In this way, the period of the count pulses CTP can thus be controlled by a quantity as much as the period t0 of the reference clock signal $\phi_0$ using the signal OVL output by the overflow detector 14.

Referring back to FIG. 1, it is obvious now that with the configuration of the digital PLL (Phase Locked Loop) comprising the elements described so far and only the digital filter 7 in the LPF 5, the number of steady-state errors can be reduced. As described earlier, however, the control timing is delayed by one period of the comparison-reference REP due to the propagation time through the digital filter 7 and the loading time of the counter oscillation period data OPD into the counter 15. Therefore, a problem that the acquisition time cannot be shortened still remains to be solved.

In order to shorten the acquisition time, the phase compensator 6 and the period compensator 8 are employed in the LPF 5 of the embodiment in addition to the digital filter 7 as shown in FIG. 1. Operations of the phase compensator 6 and the period compensator 8 are explained by referring to FIG. 14 as follows.

Figure 14A:
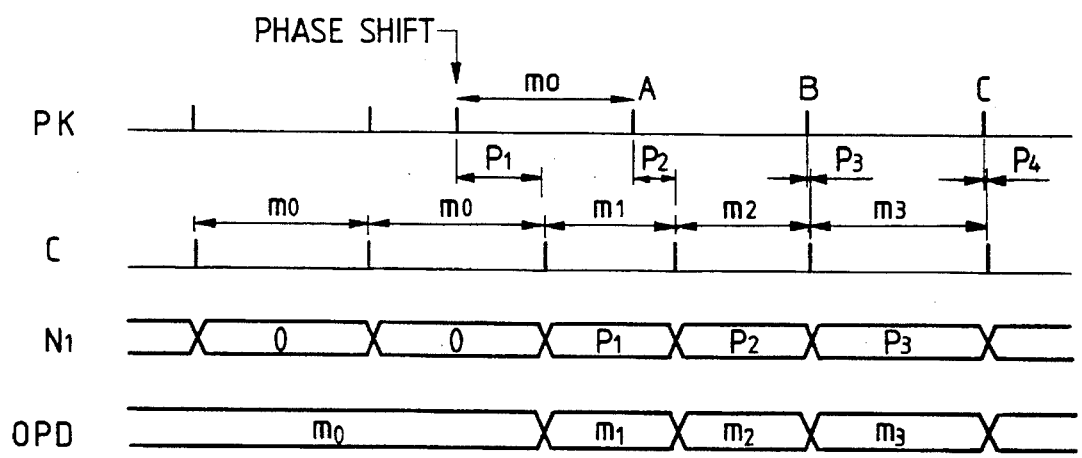
FIGS. 14(a)–(b) is explanatory diagrams showing operations of a phase compensation circuit and a period compensation circuit employed in the embodiment shown in FIG. 1.
Figure 14B:
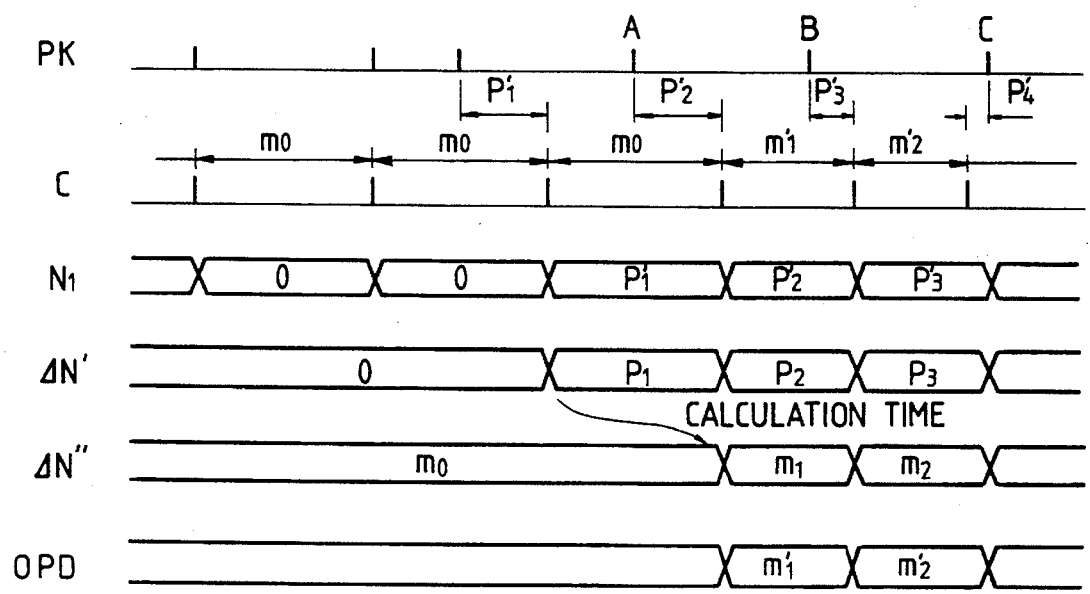

FIG. 14 shows cases in which the phase of the synchronized peak pulse signal PK undergoes step-like changes. FIG. 14 (a) shows a PLL process wherein there is no control delay whereas FIG. 14 (b) shows a PLL process in which there is a control delay. Basically, in the PLL process with a control delay, phase error data with the same value as that for the PLL process without a control delay is supplied to the digital filter 7. In this way, the counter oscillation period data OPD is output with the same value as that of the PLL process with no control delay to result in the same PLL characteristic. The phase compensator 6 and the period compensator 8 are used for compensating the phase error data into the same value as that of the PLL process without a control delay. With a point of time of a shifted phase taken as a time reference, times of points A, B and C shown in FIGS. 14 (a) and (b) are found as follows:

Point A:
$$p1 + m1 - p2 = p'1 + m0 - p'2 \quad (2)$$

Point B:
$$p1 + m1 + m2 - p3 = p'1 + m0 + m'1 - p'3 \quad (3)$$

Point C:
$$p1 + m1 + m2 + m3 - p4 = p'1 + m0 + m'1 + m'2 - p'4 \quad (4)$$

where p and m are a difference in phase and a period respectively for a case with no control delay whereas p' and m' are a difference in phase and a period respectively for a case with a control delay.

In both the cases, initial phases p1 and p'1 have the same value as follows:

$$p1 = p'1 \quad (5)$$

Substituting Eq. (5) into Eqs. (2), (3) and (4) yields the following:

$$p2 = (m1 - m0 + p'2) \quad (6)$$

$$p3 = (m2 - m1 + p'4) + (m1 + m1 - m0 - m'1) \quad (7)$$

$$p4 = (m3 - m2 + p'4) + (m2 + m2 - m1 - m'2) + (m1 + m1 - m0 - m'1) \quad (8)$$

Here, it is obvious from Eqs. (6) to (8) that the second term of Eq. (7) is equal in value to the third term of Eq. (8) and by setting the second terms of Eqs. (7) and (8) to zero, only the first terms will remain in Eqs. (6) to (8). It is thus clear from these relations that by making the phase-error data to be supplied to the digital filter 7 the same as that with no control delay, the same counter oscillation period data OPD can be obtained. It is also obvious from the relation between the left-hand side and the first term of each equation that the phase difference p with no control delay can be found from the value m output by the digital filter 7. For example, the phase difference p2 can be found from Eq. (6) as follows. Since the values m1 and m0 output by the digital filter 7 are known at the output point of time of the phase difference p'2, the phase difference p2 with no control delay can be found from the compared phase difference p'2. Similarly, the phase differences p3 and p4 can also be found as well. Leaving only the first terms, the above equations can be expressed into a recurrence formula as follows:

$$P(n) = P'(n) + \{m(n-1) - m(n-2)\} \quad (9)$$

Eq. (9) is a transformation equation which represents processing performed by the phase compensator 6.

The period compensator 8, on the other hand, plays a role of setting the second terms of Eq. (7) and (8) to zero. Setting the second terms of Eq. (7) and (8) to zero results in Eq. (10) which can be used for finding the value m'(n) of the obtained counter oscillation period data.

$$m'(n) = 2 \cdot m(n) - m(n-1) \quad (10)$$

Differences in phase and periods are compensated by the phase compensator 6 and the period compensator 8 respectively in accordance with the recurrence formulas expressed by Eqs. (9) and (10) given above.

In the case of a high-gain operation, the gaps between (the periods of) the comparison pulses C between the points A and C are merely multiplied by the frequency-division ratio N. Much like the case in which the two-frequency-divider 17 is not operating or the frequency-division ratio N has a value of unity, the recurrence transmormation formulas of the phase compensator 6 and the period compensator 8 for a high-gain operation are given by Eqs. (11) and (12) respectively as follows:

$$P(n) = N \cdot [P'(n) + \{m(n-1) - m(n-2)\}] \quad (11)$$

$$m'(n) = 2 \cdot m(n) - m(n-1) \quad (12)$$

Next, a transfer function of the digital filter 7 is explained before describing an example of the LPF 5.

Figure 15:
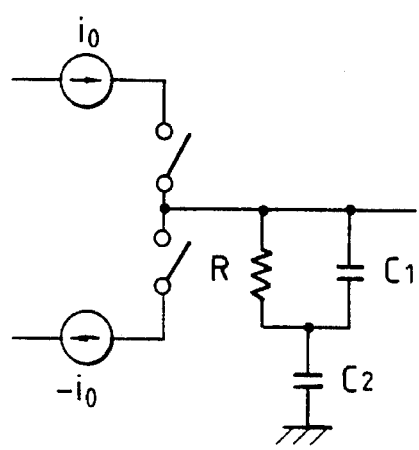
FIG. 15 shows the configuration of a filter unit employed in an analog PLL circuit.

The transfer function can be derived from a filter employed in an analog PLL circuit shown in FIG. 15. The transfer function H(s) of the analog filter can be expressed by the following equation:

$$H(S) = \frac{C_1 + C_2}{C_1 C_2} \cdot \frac{1}{S} \cdot \frac{\frac{1}{R(C_1+C_2)}}{S + \frac{1}{C_1 R}} \triangleq K_F \cdot \frac{1}{S} \cdot \frac{S + \Omega e}{S + \Omega a} \quad (13)$$

In order to perform transformation based on the transfer function H(s) from a continuous-time system in the analog world into a discrete-time system in the digital world, folding-point frequencies $\Omega a$ and $\Omega b$ of the analog filter are prewarped. This is done by substituting Eq. (14) given below into Eq. (13) given above to come up with Eq. (15) which expresses a transfer function H(z) for a digital filter.

$$S = \frac{2}{T} \cdot \frac{1 - Z^{-1}}{1 + Z^{-1}} \quad (14)$$

$$\omega_a = \frac{2}{T} \cdot \tan^{-1} \frac{\Omega a \cdot T}{2}$$

$$\omega_e = \frac{2}{T} \cdot \tan^{-1} \frac{\Omega e \cdot T}{2}$$

$$H(Z) = \frac{A_0(1 + A_1 Z^{-1})}{1 + B_1 Z^{-1}} \cdot \frac{1}{2} \cdot \frac{1 + Z^{-1}}{1 - Z^{-1}} \quad (15)$$

-continued where, $$A_0 \underline{\Delta} T \cdot \frac{\omega_e T + 2}{\omega_a T + 2}$$

$$A_1 \underline{\Delta} \frac{\omega_e T - 2}{\omega_e T + 2}$$

$$B_1 \underline{\Delta} \frac{\omega_a T - 2}{\omega_a T + 2}$$

Figure 16:
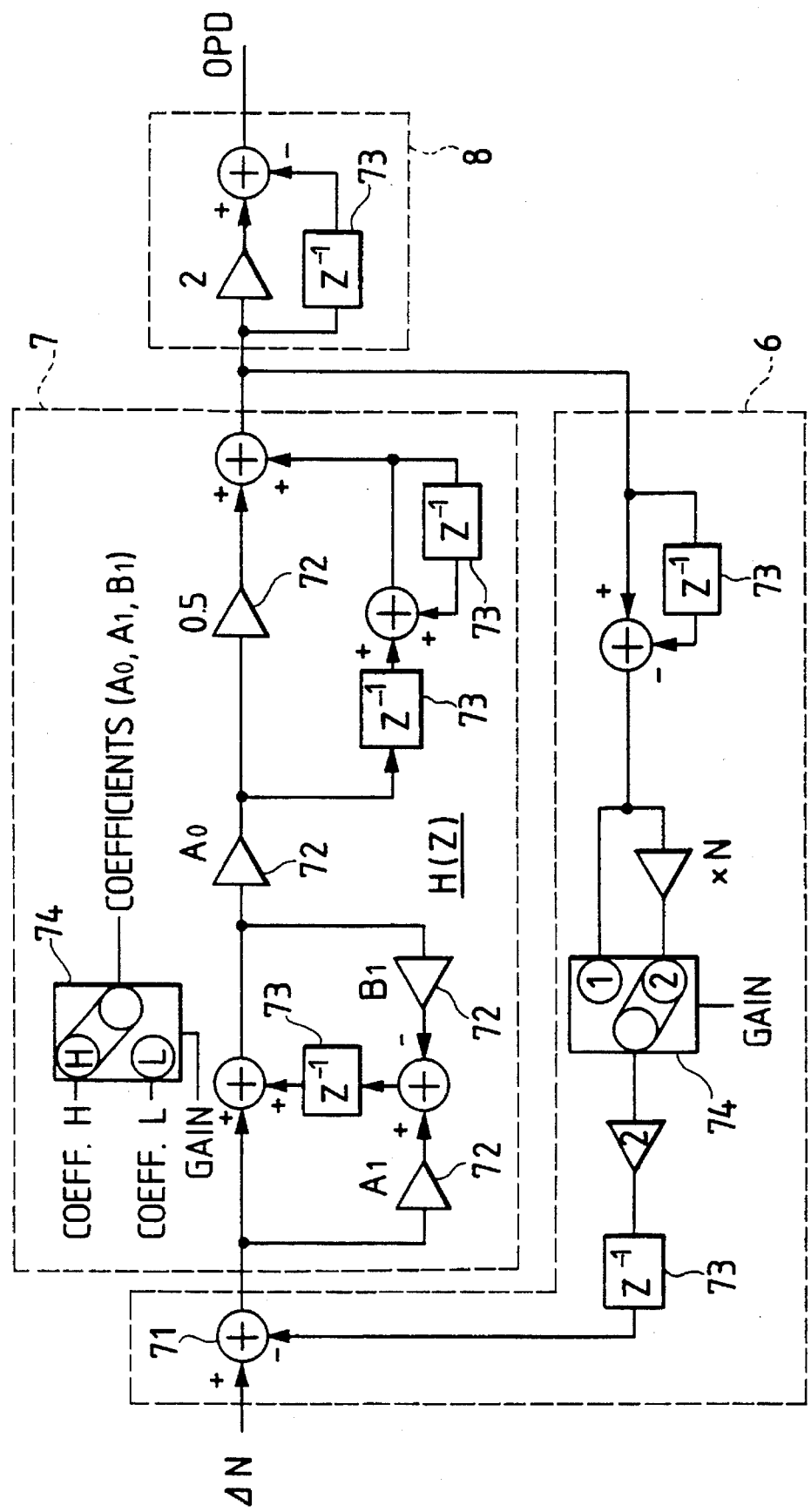
FIG. 16 shows a block diagram of an actual example of an LPF employed in the embodiment shown in FIG. 1.

FIG. 16 shows an example of the LPF 5 of FIG. 1 which is built from transfer functions of the phase compensator 6, the digital filter 7 and the period compensator 8. Reference numeral 71 shown in the figure denotes an adder whereas reference numeral 72 is a multiplier. Reference numerals 73 and 74 denote a delay element and a selector respectively. The same notations as those shown in FIG. 1 are used to denote the same components. The configuration of the example can be built with ease by implementing the above transfer function H(z) in terms of the delay element 73, the multiplier 72 for multiplication and the adder 71 for addition. Controlled by a gain switching signal, the selector 74 selects a coefficient and a phase compensation quantity for a high or low-gain operation. For example, when the operation is switched from a high gain to a low one, gain switching is accomplished through a gain switching process. The gain-switching process is executed at a time between processings of the LPF 5 which are activated by the phase-difference output clock signal $\phi_1$ from the phase detector 3. As an alternative, the gain-switching process can be activated by a phase-difference clock pulse $\phi_1$ to replace the phase-difference processing itself.

During the gain-switching process, the values output by the delay elements 73 of the phase compensator 6 are cleared to zero. The delay elements 73 of the digital filter 7 operate in such a way that the output of the digital filter 7 does not change when phases each with a value of 0 are input consecutively. In addition, the delay element 73 of the period compensator 8 outputs data having the same value as the output of the digital filter 7. By switching the gain through the gain-switching process, operational instability caused by changes in phase-compensation or period-compensation quantity due to the gain switching can be eliminated.

A transfer function Hp(z) of the phase compensator 6 and a transfer function Hm(z) of the period compensator 8 adopted in the actual example are given by Eqs. (16) and (18) respectively. A transfer function Hf(z) of the digital filter 7 is expressed by Eq. (17) which is identical with Eq. (15). It should be noted that the transfer function Hp(z) with the selector 74 in the phase compensator 6 selecting its input pin ② is also given by Eq. (16) where the value of N is set to unity.

$$Hp(Z) = 2 \cdot NZ^{-1}(1 - Z^{-1}) \tag{16}$$

$$Hf(Z) = \frac{A_0(1 + A_1 Z^{-1})}{1 + B_1 + Z^{-1}} \cdot \frac{1}{2} \cdot \frac{1 + Z^{-1}}{1 - Z^{-1}} \tag{17}$$

$$Hm(Z) = 2 - Z^{-1} \tag{18}$$

Figure 17:
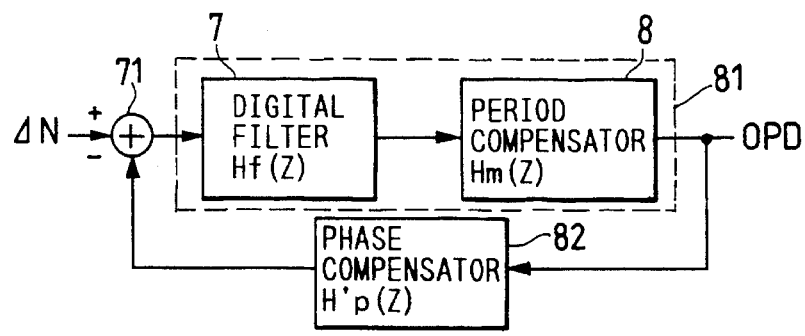
FIG. 17 shows a block diagram of another actual example of the LPF employed in the embodiment shown in FIG. 1.

FIG. 17 shows a block diagram of another example of the LPF 5 employed in the embodiment shown in FIG. 1. Reference numeral 71 shown in the figure denotes an adder whereas reference numeral 81 is a filter circuit. Reference numeral 82 denotes a phase compensator. The same notations as those shown in FIG. 1 are used to denote the same components. This example is a modified version of that shown in FIG. 16, wherein the phase compensator 82 produces a phase-compensation quantity from the counter oscillation period data OPD to give the same characteristic as that of the actual example shown in FIG. 16. In the example shown in FIG. 17, the output of the phase compensator 82 is subtracted from the internal phase error ΔN from the subtractor 4 shown in FIG. 1 to result in a difference which is supplied to the filter circuit 81 comprising a digital filter 7 and a period compensator 8 connected to each other in series. It is the filter circuit 81 that outputs the counter oscillation period data OPD. The counter oscillation period data OPD is fed back to the adder 71 through the phase compensator 82.

Let the transfer functions of the digital filter 7 and period compensator 8 in this configuration be represented by Hf(z) and Hm(z) given in Eqs. (17) and (18) respectively. Since the digital filter 7 and the period compensator 8 are connected to each other in series, the the transfer function of the filter circuit 81 is expressed by the product of the transfer functions Hf(z) and Hm(z) given by Eq. (19) as follows:

$$\begin{aligned}Hf(Z) \cdot Hm(Z) &= \frac{A_0}{2} \cdot \frac{2 + (2A_1 + 1)Z^{-1} + A_1 Z^{-2}(1 - Z^{-1}) - Z^{-2}}{1 + (B_1 - 1)Z^{-1} + (-B_1)Z^{-2}} \\ &= A_0 \left( \frac{1 + A_1' Z^{-1} + A_2'(1 - Z^{-1})Z^{-2} - \frac{1}{2} Z^{-2}}{1 + B_1' Z^{-1} + B_2' Z^{-2}} \right)\end{aligned} \tag{19}$$

where, $$A_1' \underline{\Delta} A_1 + \frac{1}{2}$$

$$A_2' \underline{\Delta} \frac{A_1}{2}$$

$$B_1' \underline{\Delta} B_1 - 1$$

$$B_2' \underline{\Delta} -B_1$$

In order to obtain the same transfer function as the example shown in FIG. 16, the phase compensator 82 in the configuration shown in FIG. 17 must have a transfer function Hp'(z) given by Eq. (20) as follows:

$$Hp'(Z) = Z^{-1} N \frac{1 - Z^{-1}}{1 - \frac{1}{2} Z^{-1}} \tag{20}$$

Figure 18:
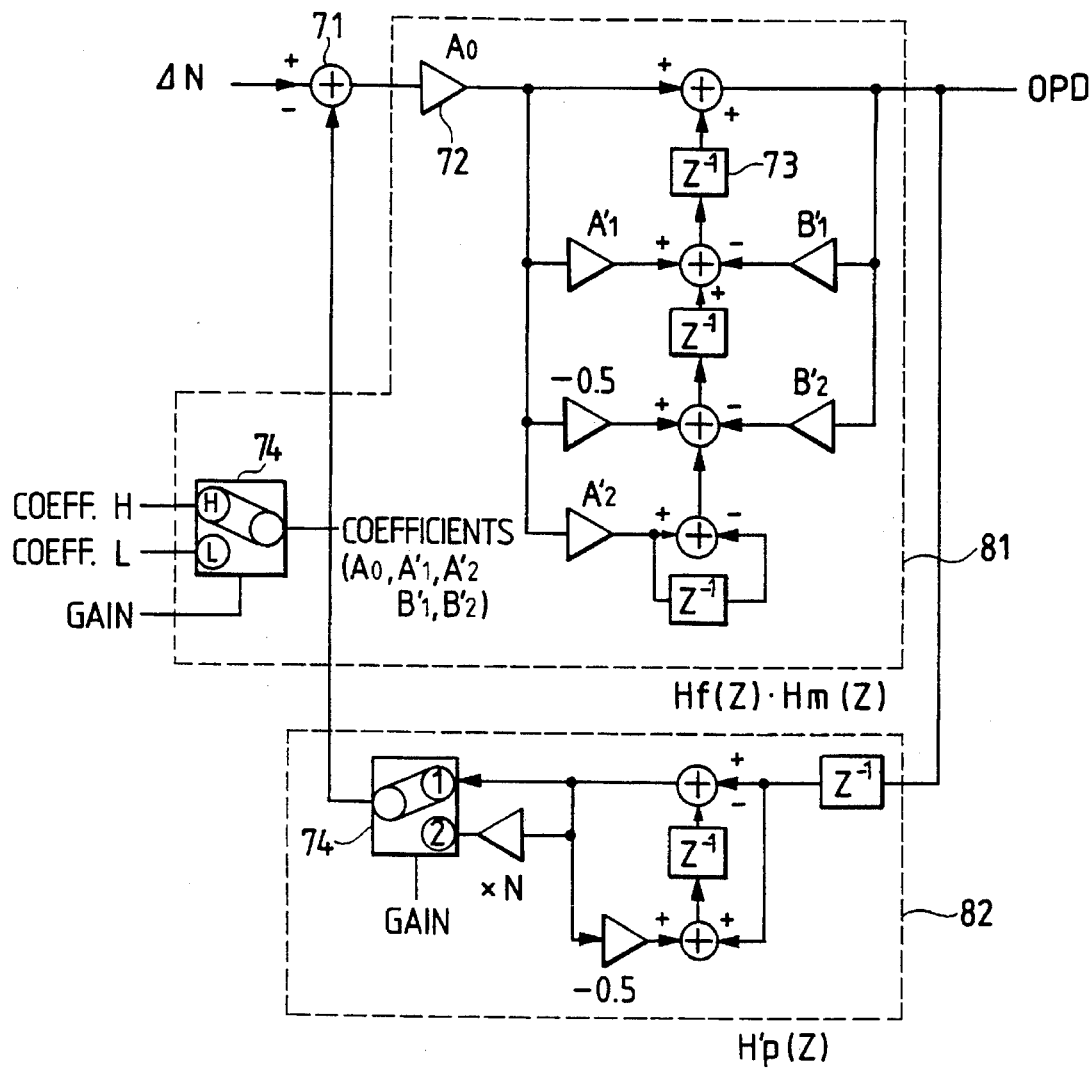
FIG. 18 is a diagram showing an actual circuit example of the LPF shown in FIG. 17.

A configuration example of the LPF 5 which comprises a filter circuit 81 with its transfer function expressed by Eq. (19) and a phase compensator 82 with its transfer function expressed by Eq. (20) is shown in FIG. 18. With the selector 74 in the phase compensator 82 selecting its input pin ①, N of Eq. (20) is set to a value of unity.

Figure 19A:
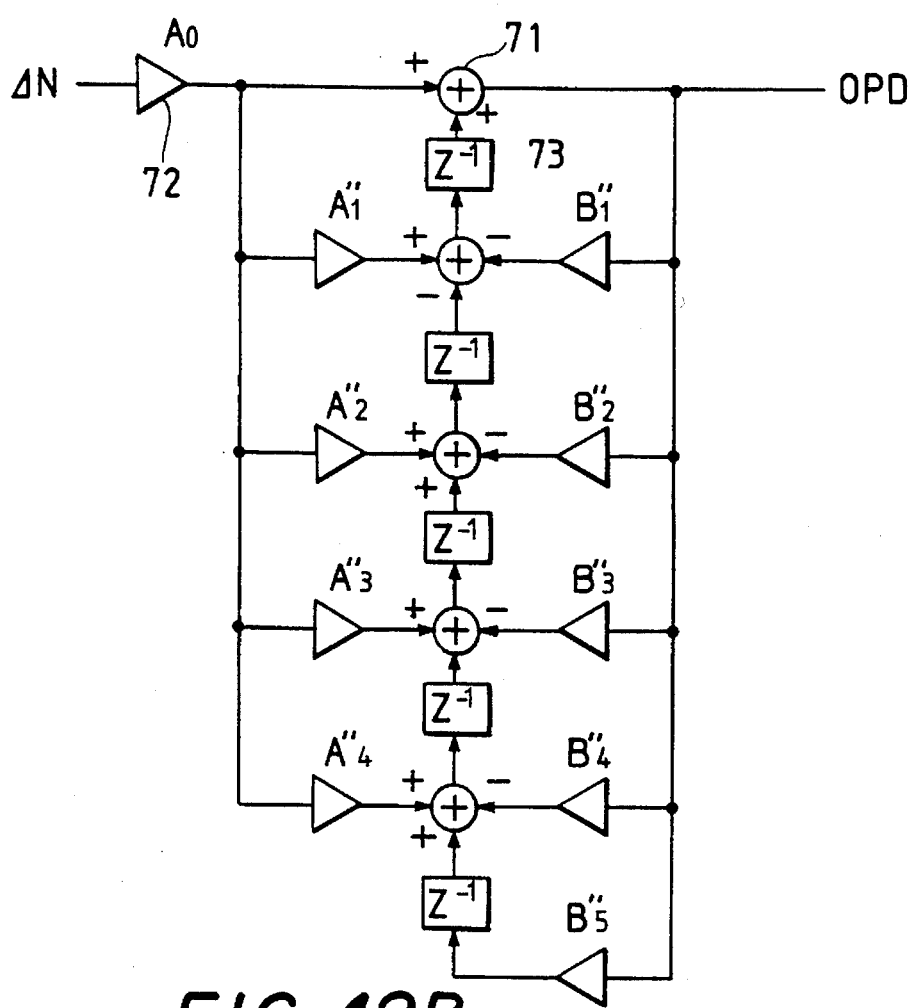
FIG. 19 shows a block diagram of still another actual example of the LPF employed in the embodiment shown in FIG. 1.
Figure 19B:
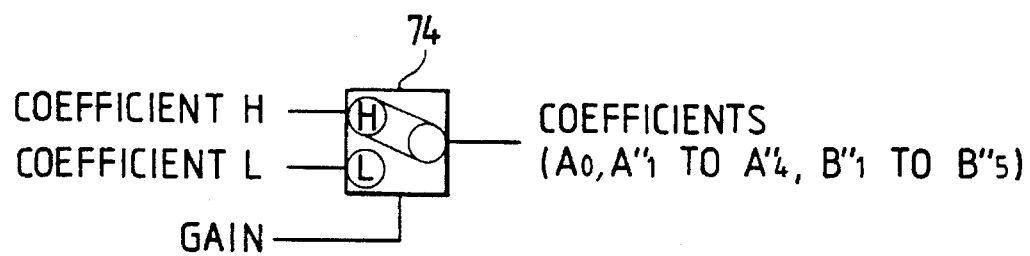

FIG. 19 shows a block diagram of still another example of the LPF 5 employed in the embodiment shown in FIG. 1.

In the example shown in FIG. 19, the transfer functions Hf(z) and Hm(z) of the digital filter 7 and the period compensator 8 respectively are combined into Eq. (19), a single equation representing the transfer function of the filter circuit 81. In the actual example shown in FIG. 19, on the other hand, the transfer function of the filter circuit 81 expressed by Eq. (19) and that of the phase compensator 82 expressed by Eq. (20) are further combined into a transfer function H0(z) expressed by Eq. (21). The single circuit shown in FIG. 18 has the transfer function $H_0(z)$, serving the functions of the LPF 5.

$$H_1(Z) = A_0 \left[ 1, A_1, -\frac{3}{4}, \frac{1-3A_1}{4}, \frac{A_1}{4} \right] \begin{bmatrix} 1 \\ Z^{-1} \\ Z^{-2} \\ Z^{-3} \\ Z^{-4} \end{bmatrix}$$

$$H_2(Z) = \left[ 1, NA_0 + B_1 - \frac{3}{2}, NA_0\left(A_1 - \frac{1}{2}\right) - \right.$$

$$\frac{3B_1 - 1}{2}, -NA_0\left(\frac{A_1}{2} + 1\right) +$$

$$\left. \frac{B_1}{2}, -NA_0\left(A_1 + \frac{1}{2}\right), N - \frac{A_0}{2}A_1 \right] \begin{bmatrix} 1 \\ Z^{-1} \\ Z^{-2} \\ Z^{-3} \\ Z^{-4} \\ Z^{-5} \end{bmatrix}$$

Figure 20A:
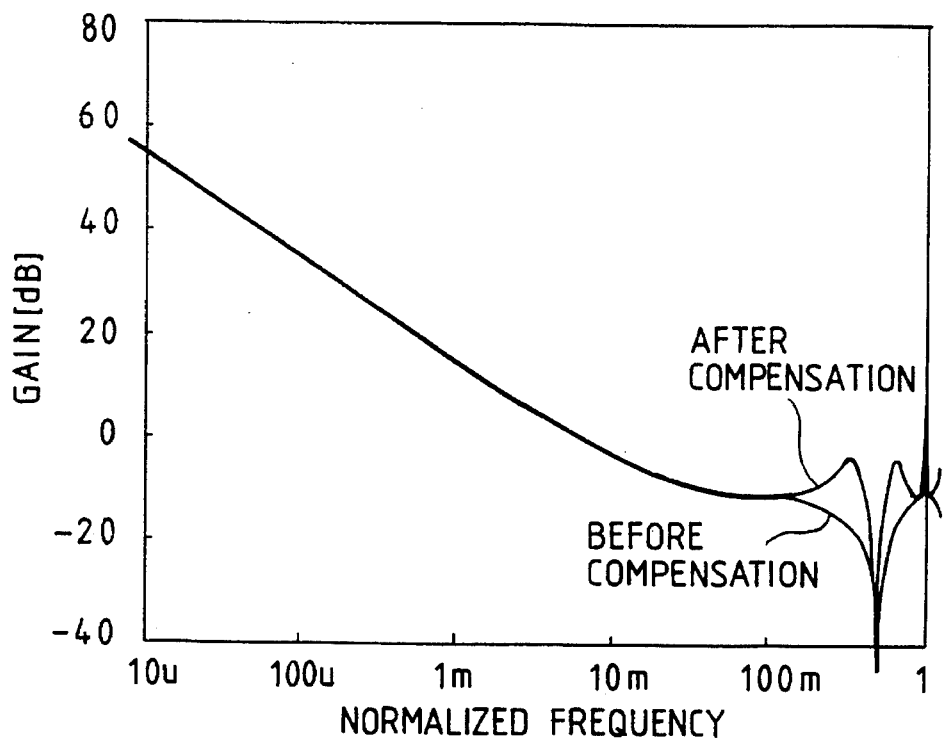
FIGS. 20(a)–(b) shows typical characteristics of the LPFs shown in FIGS. 16 to 19.
Figure 20B:
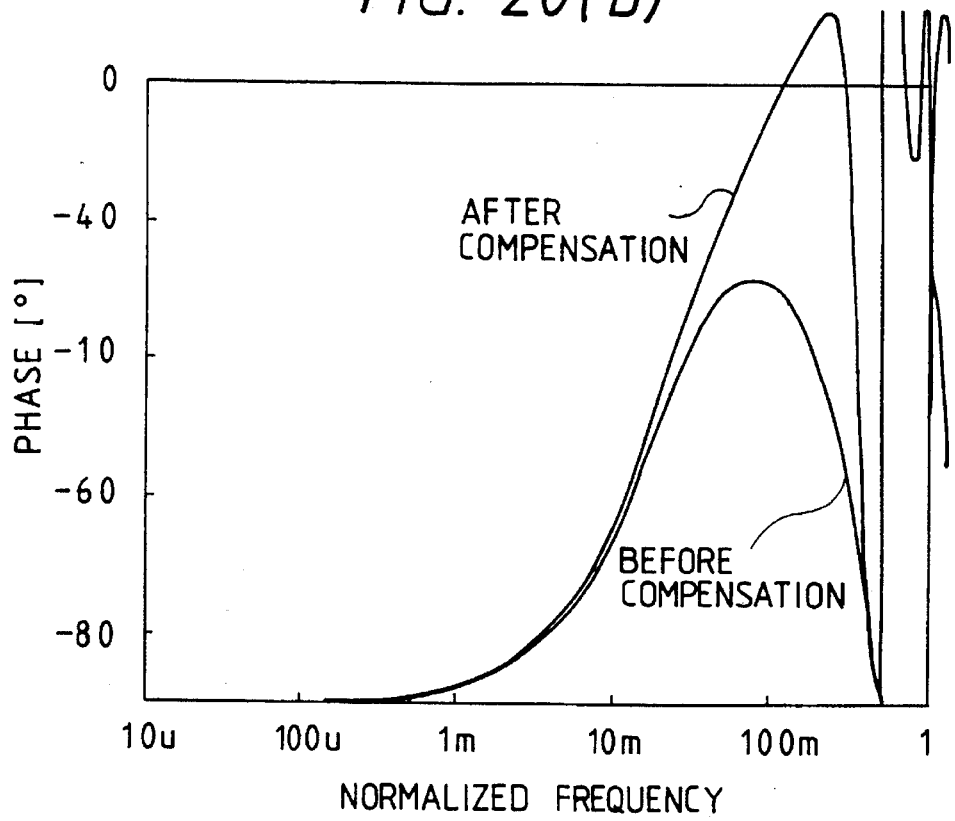

As described above, the LPF 5 can be implemented into a variety of configurations depending upon the form of its transfer function to result in the same characteristics. Comparison of the characteristics to those obtained without the phase and period compensators are shown in FIG. 20. FIG. 20 (a) and (b) show gain and phase characteristics respectively. It is obvious from the figures that by employing the phase and period compensators, variations in phase caused by control delays are compensated to result in the same characteristics as those with no control delay. Accordingly, phase margins become equal to those without control delay and the acquisition time can also be shortened as well.

Figure 21:
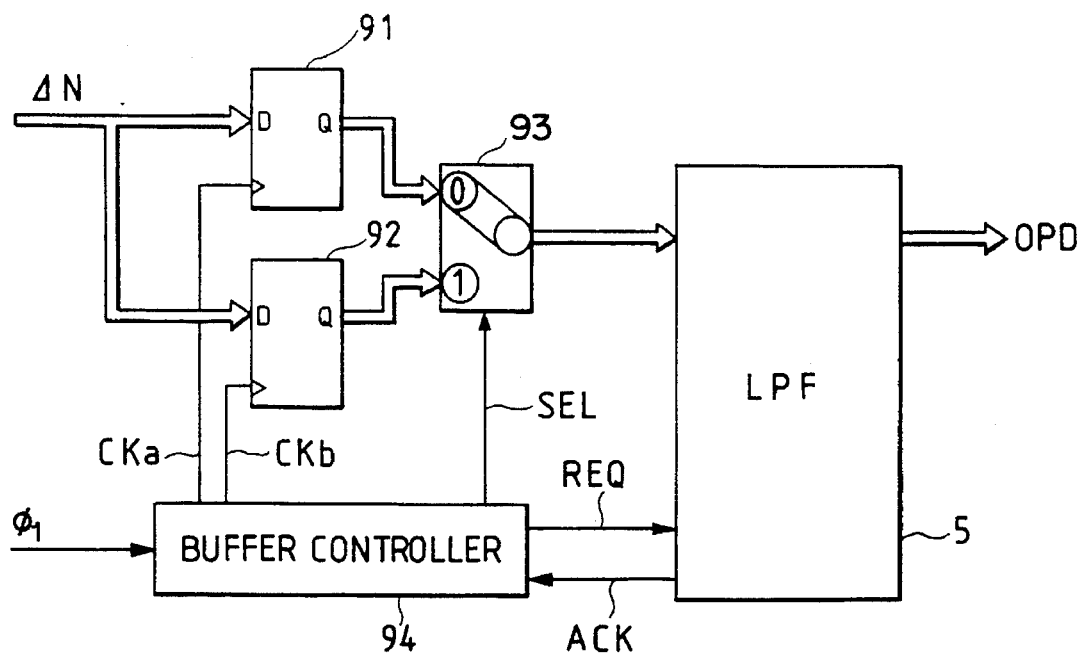
FIG. 21 shows the configuration of an actual example of an internal phase-error buffer for the embodiment shown in FIG. 1 with a LPF configured using a multi-processing unit.
Figure 22:
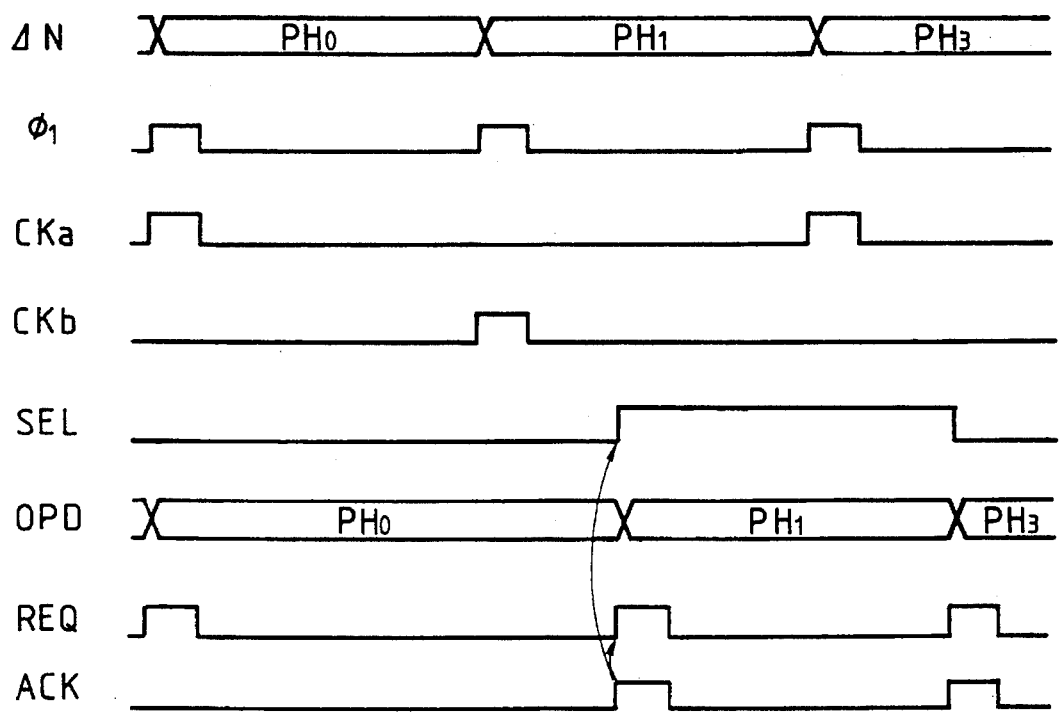
FIG. 22 shows operation timing charts of the internal phase-error buffer shown in FIG. 21.
Figure 23:
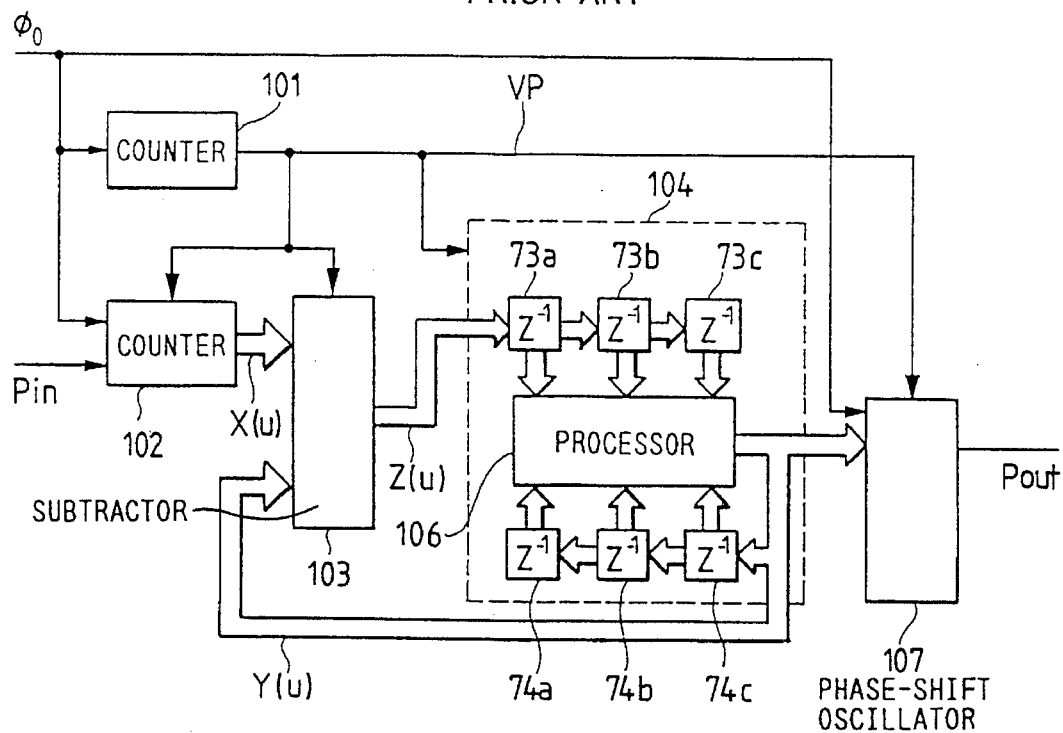
FIG. 23 is a block diagram of a typical conventional digital PLL circuit.
Figure 24:
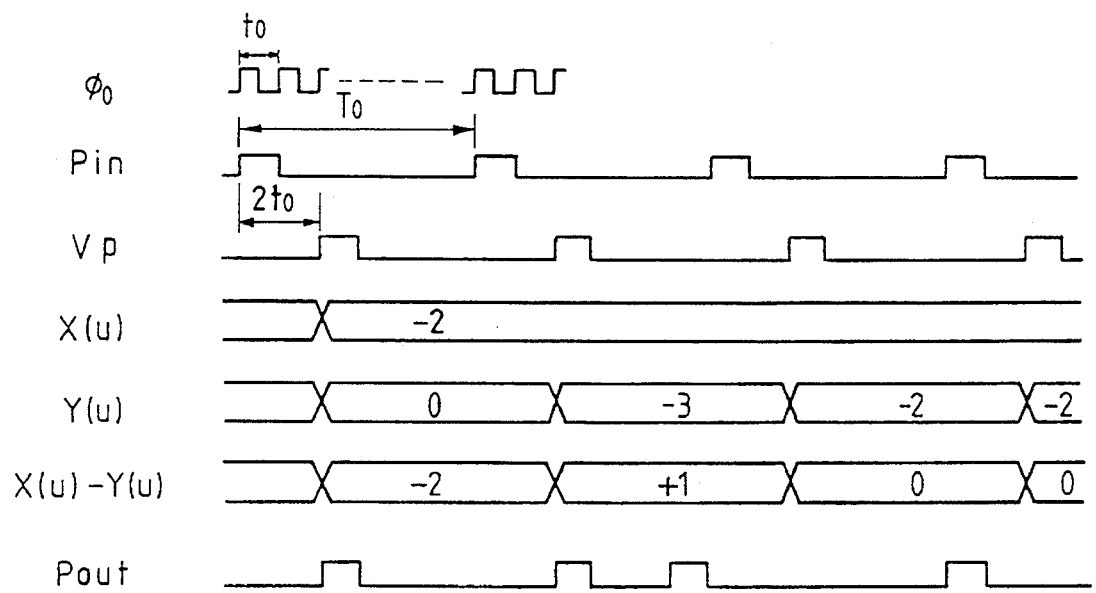
FIG. 24 shows operation timing charts of the conventional digital PLL circuit shown in FIG. 23.
Figures 25, 26:
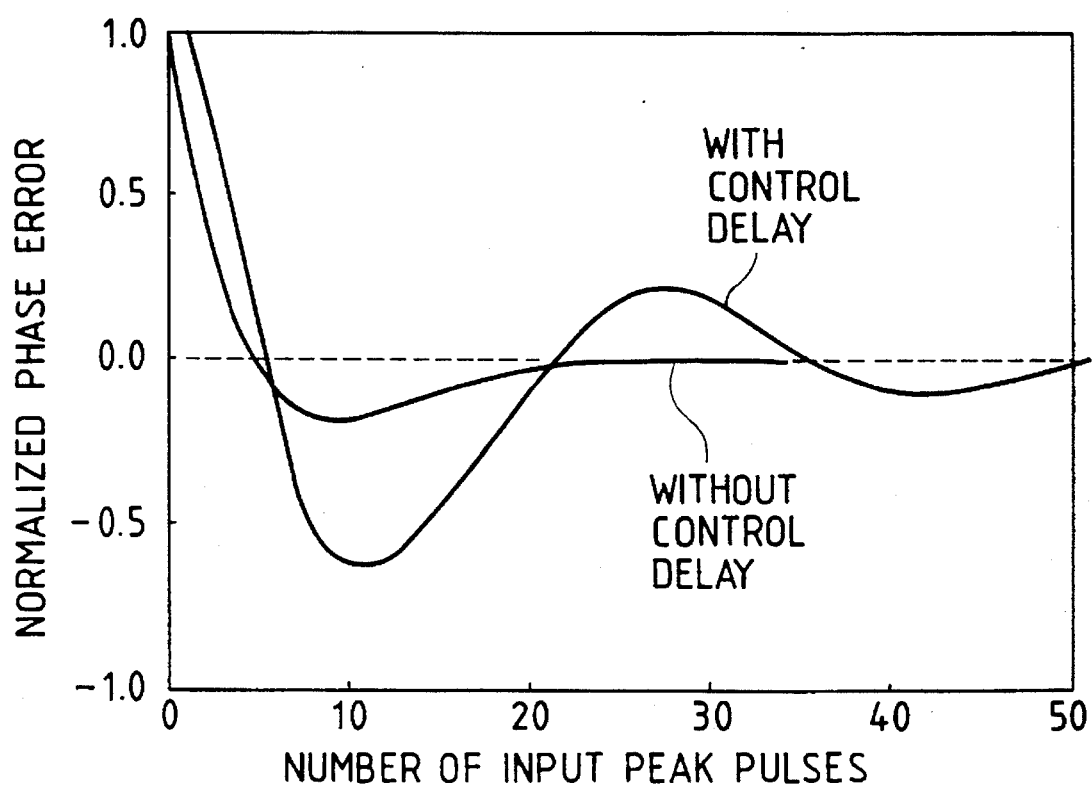
FIG. 25 shows a table comparing phase margins of an analog PLL circuit to those of the conventional digital PLL circuit.
FIG. 26 is a diagram showing comparison of the PLL characteristic of an analog PLL circuit to that of the conventional digital PLL circuit.

It should be noted that when actually designing the circuits of the LPF 5 employed in the embodiment described so far, a configuration incorporating a multiprocessing unit can be adopted in order to scale down the size of the circuitry. In this case, a configuration with a buffer provided therein is an alternative to be taken into consideration for preventing an internal phase error $\Delta N$ input in the course of processing from being spilled. An example in which a buffer is employed is shown in FIG. 21. Reference numeral 5 shown in the figure is a multiprocessing unit which serves as the LPF 5. Reference numerals 91 and 92 each denote a D-FF circuit. Reference numerals 93 and 94 are a selector and a buffer controller respectively. FIG. 22 shows timing charts for a variety of signals generated in the example shown in FIG. 21. The same notations as those shown in FIG. 21 are used in FIG. 22 to denote the same signals.

Receiving a request signal REQ, the LPF 5 comprising the multiprocessing unit shown in FIG. 21 starts processing and after a fixed time has lapsed, an acknowledge signal ACK is issued to the buffer controller 94 to indicate that the processing has been completed. As a phase-difference output clock pulse $\phi_1$ is received later on, the buffer controller 94 verifies the availability of the D-FF circuits 91 and 92 as shown in FIG. 22. If both are available, a buffer clock pulse CKa is output to the D-FF 91 circuit for storing an internal phase error $\Delta N$ thereto. At the same time, a select signal SEL is put at the "L" (low) level to request the selector 93 to input the internal phase error $\Delta N$ stored in the D-FF circuit 91 and then to forward it to the LPF 5. The buffer controller 94 then transmits the REQ signal to the LPF 5, requesting the LPF 5 to start processing.

If a phase-difference output clock pulse $\phi_1$ is received prior to the completion of processing, the buffer controller 94 generates a buffer clock pulse CKb, requesting the D-FF circuit 92 to store the internal phase error $\Delta N$ supplied thereto. As the acknowledge signal ACK for indicating the completion of the current processing is received by the buffer controller 94 from the LPF 5 later on, the select signal SEL is put at the "H" (high) level to request the selector 93 to input the internal phase error $\Delta N$ stored in the D-FF circuit 92 and then to forward it to the LPF 5. The buffer controller 94 then transmits the REQ signal to the LPF 5, requesting the LPF 5 to start processing.

By executing the operation repeatedly, even an internal phase error $\Delta N$ received in the course of processing will not be spilled and, thus, will be processed by the LPF 5. Accordingly, counter oscillation period data OPD can be obtained for each internal phase error $\Delta N$. As a result, with the LPF 5 comprising a multiprocessing unit, the size of the circuitry can be scaled down and operation can also be stabilized without spilling any internal phase error.

Figure 27:
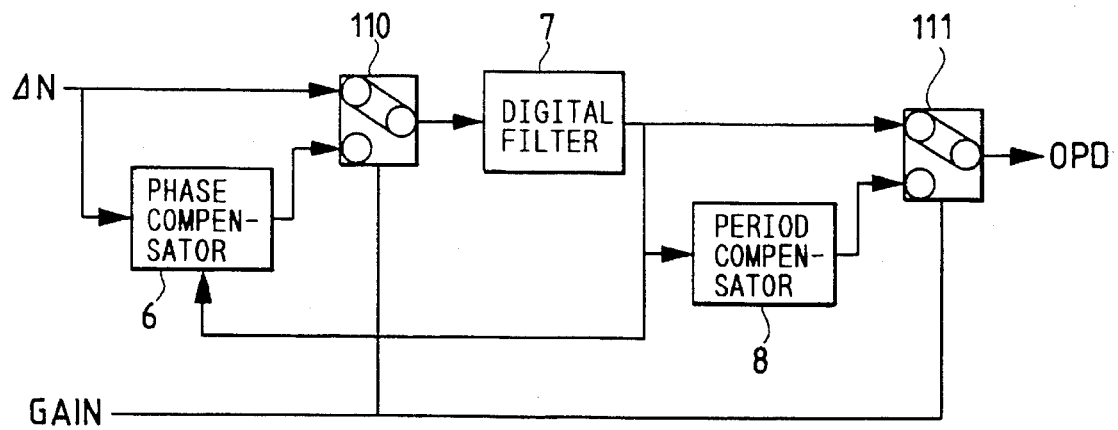
FIG. 27 is a block diagram of still another embodiment of the LPF circuit shown in FIG. 1.

The phase and period compensators 6 and 8 described above shorten the acquisition time in the case of a wide PLL loop band-width, that is, in the case of a high-gain operation. In the case of a narrow loop band-width, that is, in the case of a low-gain operation, the phase and period compensators 6 and 8 make the PLL loop frequency characteristic different from the conventional frequency characteristic resulting from a configuration without compensators. In some cases, it is thus difficult to analyze the low-gain PLL characteristic. In such cases, a configuration, in which the phase and period compensators 6 and 8 are used on a selection basis, may be adopted. A block diagram of a LPF 5 which allows the phase and period compensators 6 and 8 to be used selectively is shown in FIG. 27. The same notations as those shown in FIG. 1 are used to denote the same components. Reference numerals 110 and 111 shown in FIG. 27 are each a selector. The gain signal has a value of unity or zero for a high or low gain respectively. When the gain signal has a value of unity, indicating a high gain, the selector 110 supplies the internal phase error $\Delta N$ from the subtractor shown in FIG. 1 to the digital filter 7 through the phase compensator 6. When the gain signal has a value of zero, indicating a low gain, on the contrary, the selector 110 supplies the internal phase error $\Delta N$ from the subtractor shown in FIG. 1 to the digital filter 7 directly, by-passing the phase compensator 6. On the other hand, when the gain signal has a value of unity, indicating a high gain, the selector 111 selects the output of the period compensator 8 as the counter oscillation period data OPD. When the gain signal has a value of zero, indicating a low gain, on the contrary, the selector 111 selects the output of the digital filter 7 as the counter oscillation period data OPD, by-passing the period compensator 8. The LPF 5 having such a configuration allows the PLL loop frequency characteristic to be modified for cases with and without compensators, and the PLL characteristic for a low-gain operation with a narrow loop band-width to be analyzed with ease.

Figure 28:
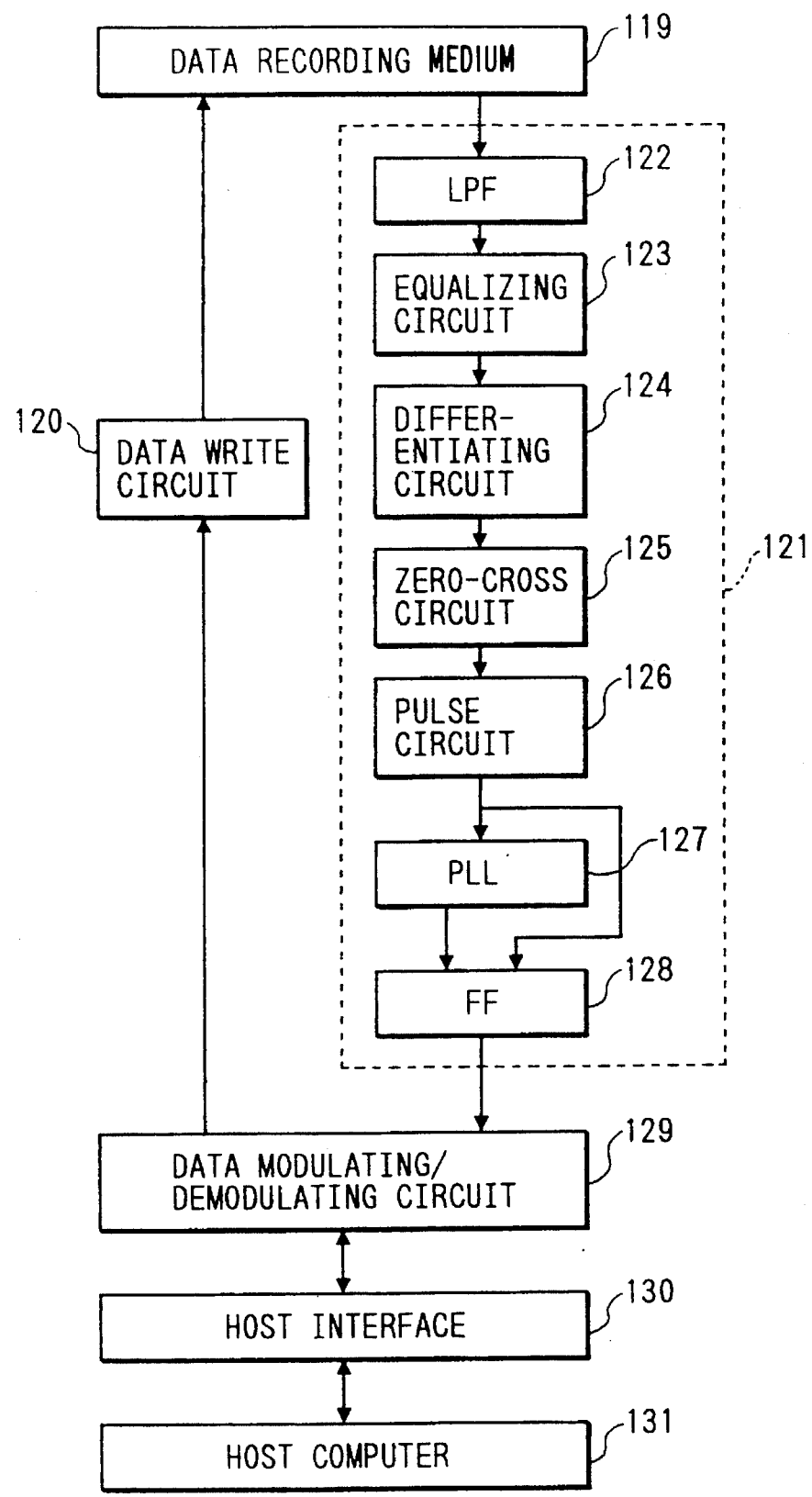
FIG. 28 is a diagram showing the configuration of a data recording/play-back apparatus employing a digital PLL circuit.

Next, a configuration of the above digital PLL circuit built in a recording/play-back apparatus is described. A recording/play-back apparatus, which employs the digital PLL circuit provided by the present invention, is shown in FIG. 28. Reference numeral 119 shown in the figure denotes a data recording medium for recording data whereas reference numeral 120 is a data write circuit. Reference numerals 121 and 122 denote a signal play-back circuit for reproducing recorded data and an LPF (low-pass filter) respectively. Reference numeral 123 is an equalizing circuit and reference numeral 124 denotes a differentiating circuit. Reference numerals 125 and 126 denote a zero-cross circuit and a pulse circuit respectively. Reference numeral 127 is the digital PLL circuit provided by the present invention whereas reference numeral 128 denotes a FF (flip-flop). Reference numerals 129 and 130 denote an modulating/demodulating circuit and a host interface circuit respectively. Reference numeral 131 is a host computer.

In order to record data transmitted by the host computer 131, the host interface circuit 130 carries out a function interfacing the data recording/play-back apparatus with the host computer 131 while the modulating/demodulating circuit 129 modulates the data to be recorded. The modulated data is then recorded into the data recording medium 119 through the data write circuit 120.

Figure 29:
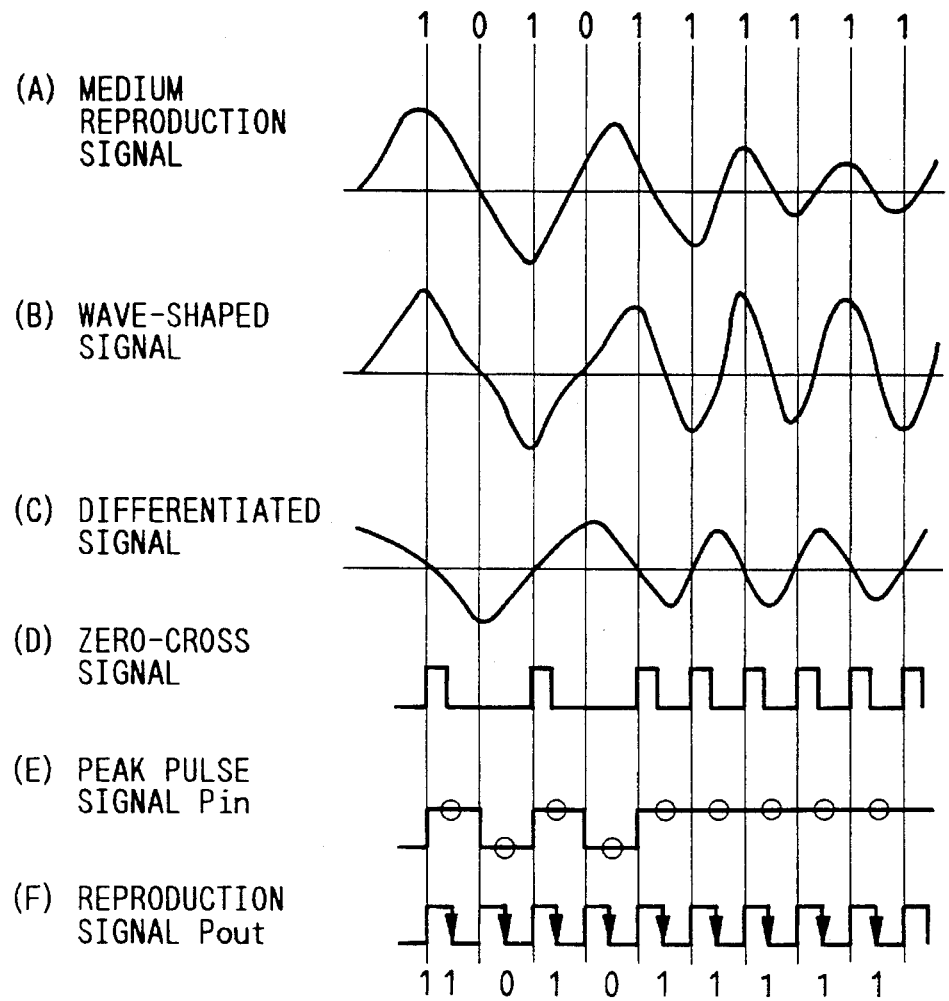
FIG. 29 shows signal wave forms at a variety of components employed in a signal reproducing circuit of the data recording/play-back apparatus shown in FIG. 28.

At a request for reproduction received from the host computer 131, recorded data is read out from the data recording medium 119. Wave forms of signals generated at a variety of signal processing circuits are shown in FIG. 29. Operations of the signal processing circuits are described by referring to the figure. Modulation data with a value of unity is generated as a peak point of a wave in the wave form of a medium reproduction signal read out from the data recording medium 119. The medium reproduction signal is shown as a wave form A in FIG. 29. As shown in the figure, such data can be indicated as a positive or negative-side peak point. In addition, the positive and negative polarities appear in the wave form alternately. Modulation data with a value of zero is obtained as a reference voltage of the wave form. An error may occur during the reproduction of data because noise is generated in a component such as the recording medium itself or the amplitude of the wave form of the medium reproduction signal varies due to wave-form interference among modulation data. The wave-form interference among modulation data is, in turn, attributed to the characteristic of the recording medium. In order to solve the problem caused by data reproduction errors, the LPF 122 eliminates noise generated by, among other components, the recording medium. The equalizing circuit 123, on the other hand, prevents inter-symbol-interference among modulation data from occurring. The countermeasures for eliminating the causes of errors wave-shape the wave form of the medium reproduction signal generated from the data recording medium 119. In order to extract peak points from the wave form of the medium reproduction signal, the wave-shaped signal, which is shown as a wave form B in FIG. 29, is supplied to the differentiating circuit 124. The differentiating circuit 124 differentiates the wave-shaped signal, producing a differentiated signal which is shown as a wave form C in FIG. 29. The zero-cross circuit 125 generates a zero-cross signal which is shown as wave form D in FIG. 29. As shown in the figure, the zero-cross signal is a train of pulses that each appear as the voltage of the differentiated signal becomes zero. The pulse circuit 126 converts the zero-cross signal into a peak pulse signal Pin which is shown as a wave form E in FIG. 29. As shown in the figure, the peak pulse signal Pin is a train of pulses which each have a fixed pulse width and correspond to a pulse of the zero-cross signal. The digital PLL circuit 127 generates an output signal Pout synchronized to the peak pulse signal Pin. The output signal Pout is shown as wave form F in FIG. 29. The peak pulse signal Pin is demodulated by the modulating/demodulating circuit 129 after undergoing timing adjustment at the FF 128. The demodulated data is transmitted to the host computer 131 through the host interface circuit 130.

Examples of the recording/play-back apparatus described above include a hard-disk drive, an optical-tape drive and a magnetic-disk drive. The digital PLL circuit, which can shorten the acquisition time of the phase and period compensators as well as reduce the number of steady-state errors, is dispensable to such a recording/play-back apparatus or the signal reproduction circuit of the recording/play-back apparatus.

What is claimed is:

1. A phase-locked loop circuit for generating a reproduction signal synchronized to an input signal comprising:

a phase detector for detecting a difference in phase between said input signal and said reproduction signal;

a filter for processing a compensated difference in phase and generating a signal for controlling an oscillation frequency;

a phase compensator for compensating a time delay to be experienced in said filter by a signal representing said difference in phase output by said phase detector and outputting said compensated difference in phase;

an oscillation-frequency compensator for compensating said signal for controlling said oscillation frequency and generating a signal for controlling compensated oscillation frequency; and an oscillator for generating said reproduction signal based on said signal for controlling said compensated oscillation frequency.

2. A phase-locked loop circuit according to claim 1, wherein said filter is a digital filter and said signal for controlling said oscillation frequency, said signal representing said difference in phase and said signal for controlling said compensated oscillation frequency are digital data.

3. A phase-locked loop circuit according to claim 1, wherein said filter is an analog filter and said signal for controlling said oscillation frequency, said signal representing said difference in phase and said signal for controlling said compensated oscillation frequency are analog signals.

4. A phase-locked loop circuit according to claim 1, wherein a total transfer function of said filter, said phase compensator and said oscillation-frequency compensator is expressed by the following calculation:

$$Hf*H2/(1+Hf*H1)$$

where Hf is a transfer function of said filter, H1 is a transfer function of said phase compensator and H2 is a transfer function of said oscillation frequency compensator.

5. A digital phase-locked loop circuit for generating an output signal synchronized to an input signal comprising:

a phase detector for measuring a difference in phase between said input signal and said output signal in terms of reference clock pulses;

a digital filter for processing compensated phase-error data and generating oscillation period data for use in setting an oscillation period;

a phase compensator for compensating a control delay to be experienced in said digital filter by said difference in phase output by said phase detector and outputting said compensated phase-error data;

a period compensator for compensating said oscillation period data and outputting compensated oscillation period data; and an oscillator for generating said output signal based on said compensated oscillation period data.

6. A phase-locked loop circuit according to claim 5, wherein said period compensator is connected in cascade to said digital filter and said phase compensator processes an output of said digital filter to be fed back to an input side of said digital filter.

7. A phase-locked loop circuit according to claim 5, wherein said period compensator and said digital filter form a filter circuit and said phase compensator filters an output of said filter circuit to be fed back to an input side of said filter circuit.

8. A phase-locked loop circuit according to claim 5 further comprising said digital filter, said phase compensator, and said period compensator with a transfer function thereof approximated by $$Hf*H2/(1+Hf*H1)$$

where Hf is a transfer function of said digital filter, H1 is a transfer function of said phase compensator and H2 is a transfer function of said period compensator whereas H1 and H2 transfer functions are expressed by the following equations:

$$H1=2 \cdot N \cdot Z^{-1}(1-Z^{-1})$$

$$H2=2-Z^{-1}.$$

9. A phase-locked loop circuit according to claim 5 further comprising a compensator selector for selecting said phase compensator and said period compensator.

10. A phase-locked loop circuit according to claim 5, wherein said phase compensator, said digital filter and said period compensator are constructed with a multiprocessing scheme, and further comprising a means for holding said difference in phase till completion of a calculation of said difference in phase by said multiprocessing scheme of said phase compensator, said digital filter and said period compensator.

11. A phase-locked loop circuit according to claim 5, further comprising:

an error accumulating means for accumulating quantized errors of said compensated oscillation period data from said period compensator; and a processing means for subtracting said difference in phase from output of said error accumulating means.

12. A phase-locked loop circuit according to claim 11, further comprising a processing means for incrementing or decrementing said compensated oscillation period of said oscillator in reference-clock-pulse units by using an output of said error accumulating means, and then said oscillator generates said output signal based on output of said processing means.

13. A phase-locked loop circuit according to claim 5, wherein said phase compensator, said period compensator and said digital filter constitute a signal reentrant digital filter with coefficients set to values given by the following row vector equations:

$$An=A0[1, A1, -0.75, 0.25 -0.75A1, 0.25A1].$$

$$Bn=[1, N\,A0+B1-1.5, N\,A0(A1-0.5)-1.5B1+0.5, -N\,A0(0.5A1+1)+0.5B1, -N\,A0(A1+0.5), 0.5N\,A0\,A1].$$

and, a transfer function Hk(z) from an input of said phase compensator to an output of said period compensator is given by the following equations:

$$Hk(z) = \frac{An\,Zn(5)}{Bn\,Zn(6)}$$

where Zn(m) is a following equation, $$Zn(m) = \begin{bmatrix} 1 \\ Z^{-1} \\ Z^{-2} \\ \cdot \\ \cdot \\ \cdot \\ Z^{-m} \end{bmatrix}$$

and "m" is a natural number.

14. A digital phase-locked loop circuit for generating an output signal synchronized to an input signal comprising:

a phase detector for measuring a difference in phase between said input signal and said output signal in terms of reference clock pulses;

a digital filter with a coefficient selector for processing compensated phase-error data and generating oscillation period data for use in setting an oscillation period;

a phase compensator for compensating a control delay to be experienced in said digital filter by said difference in phase output by said phase detector and outptutting said compensated phase-error data;

a period compensator for compensating said oscillation period data and outputting compensated oscillation period data; and an oscillator for generating said output signal based on said compensated oscillation period data.

15. A phase-locked loop circuit according to claim 14, wherein said coefficients selector is switched from one to other coefficients through a coefficients switching process not causing said compensated oscillation period data to change.

16. A phase-locked loop circuit according to claim 14, further comprising a selection means for selectively using said phase compensator and said period compensator in accordance with a selectivity of said coefficients selector.

17. A phase-locked loop circuit according to claim 14, further comprising quantized means for said difference in phase output as a quantized difference in phase varies a number of bits of said difference in phase in accordance with a selectivity of said coefficients selector, and then supplies said quantized difference in phase to said phase compensator.

18. A data reproduction apparatus for generating a reproduction signal synchronized to an input signal and reproducing input data based on said reproduction signal, said data reproduction apparatus comprising:

a phase detector for measuring a difference in phase between said input signal and said reproduction signal in terms of reference clock pulses;

a digital filter for processing a compensated difference in phase and generating oscillation period data for use in setting an oscillation period;

a phase compensator for compensating a control delay to be experienced in said digital filter by said difference in phase output by said phase detector and outputting said compensated difference in phase;

a period compensator for compensating said oscillation period data and outputting compensated oscillation period data; and an oscillator for generating said output signal based on said compensated oscillation period data.

19. A digital phase-locked loop circuit for generating an output signal synchronized to an input signal comprising:

sampling means for sampling said input signal on rising edges trailing edges of reference clock pulses and outputting a sampled signal with a value ranging from a peak to peak in sampling errors time is one clock period of a reference clock pulse or less;

a phase detector for measuring a difference in phase between said sampled signal output by said sampling means and said output signal in terms of said reference clock pulses and outputting the number of counted reference clock pulses as phase-difference data;

a filter for processing said phase-difference data and generating oscillation period data for use in setting an oscillation period; and an oscillator for generating said output signal with said oscillation period based on said oscillation period data.

20. A phase-locked loop signal generation method for generating an output signal synchronized to an input signal by using a digital filter, said phase-locked loop signal generation method comprising the steps of:

measuring a difference in phase between said input signal and said output signal in terms of reference clock pulses;

generating phase-difference data based on said measured difference;

compensating a control delay to be experienced in said digital filter by said phase-difference data and outputting compensated phase-error data;

processing said compensated phase-error data and generating oscillation period data for use in setting an oscillation period;

compensating said oscillation period data and outputting compensated oscillation period data; and generating said output signal based on said compensated oscillation period data.

21. A phase-locked loop signal generation method according to claim 20 further comprising the step of holding said compensated phase-error data supplied in the course of multiprocessing by said digital filter till completion of said multiprocessing by said digital filter.

22. A phase-locked loop signal generation method according to claim 20, further comprising the steps of:

accumulating quantized errors of said compensated oscillation period data; and said compensating a control delay further comprising compensating said phase-difference data by using said accumulating quantized errors and outputting said compensated phase-error data.

23. A phase-locked loop signal generation method according to claim 22, wherein said compensated oscillation period data is incremented or decremented in reference-clock-pulse units by using said accumulating quantized errors.

24. A phase-locked loop signal generation method according to claim 22, wherein said processing of said compensated phase-error data is processed at one of frequency characteristics, and further comprising the step of decreasing accuracy of said phase-difference data in accordance with frequency characteristics of processing of said compensated phase-error data and the step of outputting data for compensating a control delay.

25. A phase-locked loop signal generation method for generating an output signal synchronized to an input signal by using a digital filter, said phase-locked loop signal generation method comprising the steps of:

sampling said input signal on rising edges or trailing edges of reference clock pulses and outputting a sampled signal with a value ranging from a peak to peak in sampling errors time is one clock period of a reference clock pulse or less;

measuring a difference in phase between said sampled signal and said output signal in terms of said reference clock pulses and outputting the number of counted reference clock pulses as pahse-difference data;

utilizing said digital filter for processing said phase-difference data and generating oscillation period data for use in setting an oscillation period; and generating said output signal with said oscillation period based on said oscillation period data.

* * * * *